United States Patent
Song et al.

(10) Patent No.: US 11,236,271 B2
(45) Date of Patent: Feb. 1, 2022

(54) LIQUID-CRYSTAL MEDIA AND LIGHT MODULATION ELEMENT

(71) Applicant: Merck Patent GmbH, Darmstadt (DE)

(72) Inventors: Dong-Mee Song, Hwaseong (KR); Hyun-Woo Bae, Seoul (KR); Jung-Min Lee, Seoul (KR); Yong-Kuk Yun, Hwaseong (KR)

(73) Assignee: Merck Patent GmbH, Darmstadt (DE)

( * ) Notice: Subject to any disclaimer, the term of this patent is extended or adjusted under 35 U.S.C. 154(b) by 99 days.

(21) Appl. No.: 16/330,808

(22) PCT Filed: Sep. 4, 2017

(86) PCT No.: PCT/EP2017/072050
§ 371 (c)(1),
(2) Date: Mar. 6, 2019

(87) PCT Pub. No.: WO2018/046421
PCT Pub. Date: Mar. 15, 2018

(65) Prior Publication Data
US 2019/0185746 A1      Jun. 20, 2019

(30) Foreign Application Priority Data
Sep. 7, 2016 (EP) .................................. 16187608

(51) Int. Cl.
*C09K 19/04* (2006.01)
*C09K 19/54* (2006.01)
(Continued)

(52) U.S. Cl.
CPC .............. *C09K 19/04* (2013.01); *C09K 19/54* (2013.01); *C09K 19/60* (2013.01); *C09K 19/601* (2013.01);
(Continued)

(58) Field of Classification Search
CPC ...................................................... C09K 19/04
See application file for complete search history.

(56) References Cited

U.S. PATENT DOCUMENTS

| 7,696,257 B2 | 4/2010 | Akutsu et al. |
| 8,992,796 B2 | 3/2015 | Hasebe et al. |

(Continued)

FOREIGN PATENT DOCUMENTS

| CN | 101891845 B | * | 8/2013 |
| CN | 101891845 B | | 8/2013 |

(Continued)

OTHER PUBLICATIONS

Heo et al. AIP Advances Fast-Switching Initially-transparent liquid crystal light shutter with crossed patterned electrodes American Institute of Physics, 2 Huntington Quadrangle,Melville, NY 11747,vol. 5, No. 4, Apr. 28, 2015 (Apr. 28, 2015), XP012197021,DOI: 10.1063/1.4918277 (2015) (Year: 2015).*

(Continued)

*Primary Examiner* — Chanceity N Robinson
(74) *Attorney, Agent, or Firm* — Millen White Zelano & Branigan; Richard Traverso

(57) ABSTRACT

The present invention relates to liquid crystalline (LC) medium, to a method of its production and to the use of such LC media in polymer network liquid crystalline (PNLC) light modulation elements operated in the normally transparent mode. Furthermore, the present invention relates to such light modulation elements, as such, to the use of such light modulation elements as light shutters for transparent OLED displays, to the use of such light modulation elements in smart windows, and to a method of production of such light modulation elements according to the present invention.

17 Claims, 5 Drawing Sheets

(51) Int. Cl.
*C09K 19/60* (2006.01)
*G02F 1/1334* (2006.01)
*H01L 27/32* (2006.01)
*C09K 19/12* (2006.01)
*C09K 19/30* (2006.01)
*C09K 19/32* (2006.01)
*C09K 19/34* (2006.01)

(52) U.S. Cl.
CPC ........ *G02F 1/1334* (2013.01); *H01L 27/3232* (2013.01); *C09K 2019/0448* (2013.01); *C09K 2019/123* (2013.01); *C09K 2019/301* (2013.01); *C09K 2019/303* (2013.01); *C09K 2019/305* (2013.01); *C09K 2019/3009* (2013.01); *C09K 2019/3016* (2013.01); *C09K 2019/3021* (2013.01); *C09K 2019/3027* (2013.01); *C09K 2019/3031* (2013.01); *C09K 2019/3037* (2013.01); *C09K 2019/3051* (2013.01); *C09K 2019/3071* (2013.01); *C09K 2019/3077* (2013.01); *C09K 2019/3078* (2013.01); *C09K 2019/323* (2013.01); *C09K 2019/328* (2013.01); *C09K 2019/3425* (2013.01); *G02F 1/13345* (2021.01)

(56) References Cited

U.S. PATENT DOCUMENTS

| | | |
|---|---|---|
| 9,588,369 B2 | 3/2017 | Min et al. |
| 9,650,573 B2 | 5/2017 | Archetti et al. |
| 2015/0036095 A1 | 2/2015 | Jeong et al. |
| 2015/0108401 A1* | 4/2015 | Hirai ...................... C09K 19/54 |
| | | 252/299.4 |
| 2016/0178813 A1* | 6/2016 | Liao ........................ C08G 63/54 |
| | | 252/586 |
| 2017/0174992 A1* | 6/2017 | Ootsuki ............. C09K 19/3486 |

FOREIGN PATENT DOCUMENTS

| | | | |
|---|---|---|---|
| EP | 1780209 A1 * | 5/2007 | ........... C07D 405/12 |
| EP | 1780209 B1 | 3/2010 | |
| EP | 2817388 A1 | 12/2014 | |
| EP | 2399942 B1 | 8/2017 | |
| TW | 201337397 A | 9/2013 | |
| WO | 10012363 A1 | 2/2010 | |
| WO | WO-2010012363 A1 * | 2/2010 | ............. C09K 19/12 |
| WO | 14183825 A | 11/2014 | |
| WO | WO-2014183825 A1 * | 11/2014 | ........... C09K 19/601 |

OTHER PUBLICATIONS

Machine Translation of CN 101891845 B (Year: 2021).*
Heo Joon et al: fast-switching Initially-transparent Liquid Crystal Light Shutter With Crossed Patterned Electrodes AIP Advances, American Institute of Physics, 2 Huntington Quadrangle, Melville, NY 11747, vol. 5, No. 4, Apr. 28, 2015 (Apr. 28, 2015).
International Search Report PCT/EP2017/072050 dated Dec. 20, 2017 (pp. 1-2).
Office Action in corresponding ROC (Taiwan) Patent Application No. 106130371 dated Mar. 22, 2021 (pp. 1-6) English.

* cited by examiner

LIQUID-CRYSTAL MEDIA AND LIGHT MODULATION ELEMENT

TECHNICAL FIELD

The present invention relates to liquid crystalline (LC) medium, to a method of its production and to the use of such LC media in polymer network liquid crystalline (PNLC) light modulation elements operated in the normally transparent mode. Furthermore, the present invention relates to such light modulation elements, as such, to the use of such light modulation elements as light shutters for transparent OLED displays, to the use of such light modulation elements in smart windows, and to a method of production of such light modulation elements according to the present invention.

STATE OF THE ART

See-through displays or transparent displays have received increasing attention as next-generation displays, as described, for example, by C.-H. Lin, W.-B. Lo, K.-H. Liu, C.-Y. Liu, J.-K. Lu, and N. Sugiura, "Novel transparent LCD with tunable transparency," SID Dig. Tech. Pap. 43, 1159-1162 (2012), and B.-J. Mun, W. S. Kang, J. H. Lee, H. C. Choi, B. Kim, B. Kang, Y. J. Lim, S. H. Lee, and G.-D Lee, "A high transmittance colour liquid crystal display mode with controllable colour gamut and transparency," Opt. Express 22, 12505-12512 (2013).

Most of current researches are focused on see-through displays using organic light emitting diodes (OLEDs), as, for example, described by C. W. Tang and S. A. VanSlyke, "Organic electroluminescent diodes," Appl. Phys. Lett. 51, 913-915 (1987) and G. Gu, V. Bulović, P. E. Burrows, S. R. Forrest, and M. E. Thompson, "Transparent organic light emitting devices," Appl. Phys. Lett. 68, 2606-2608 (1996).

A pixel in a see-through OLED display is divided into transparent and light-emitting parts. One can see the background image through the transparent part. However, it is not possible to obtain black colour in a see-through OLED display because the transparent part is continuously open to the background. As a result, see-through OLED display panels exhibit poor visibility. This inevitable problem can be solved by placing a light shutter at the back of a see-through display.

Several types of light shutters using liquid crystals (LCs), such as polymer-dispersed LC, LC gel, cholesteric LC (ChLC), and dye-doped LC, have been proposed, for example, by J. W. Doane, N. A. Vaz, B. G. Wu, and S. umer, "Field controlled light scattering from nematic micro droplets," App. Phys. Lett. 48, 269-271 (1986), R. A. M. Hikmet, "Electrically induced light scattering from anisotropic gels," J. Appl. Phys. 68, 4406-4412 (1990), D.-K. Yang, J. L. West, L.-C. Chien, and J. W. Doane, "Control of reflectivity and bistability in displays using cholesteric liquid crystals," J. Appl. Phys. 76, 1331-1333 (1994), H. Ren, Y.-H. Lin, Y.-H. Fan, and S.-T. Wu, "In-plane switching liquid crystal gel for polarization-independent light switch," J. Appl. Phys. 96, 3609-3611 (2004), G. D. Love, A. K. Kirby, and R. A. Ramsey, "Sub-millisecond, high stroke phase modulation using polymer network liquid crystals," Opt. Express 18, 7384-7389 (2010), G. H. Lee, K. Y. Hwang, J. E. Jang, Y. W. Jin, S. Y. Lee, and J. E. Jung, "Characteristics of colour optical shutter with dye-doped polymer network liquid crystal," Opt. Lett. 36, 754-756 (2011), J. Sun, R. A. Ramsey, Y. Chen, and S.-T Wu, "Submillisecond-response sheared polymer network liquid crystals for display applications," J. Disp. Technol. 8, 87-90 (2012), and B.-H. Yu, J.-W. Huh, K.-H. Kim, and T.-H. Yoon, "Light shutter using dichroic-dye-doped long-pitch cholesteric liquid crystals," Opt. Express 21, 29332-29337 (2013).

More recently, Yoon et al. suggested in AIP Advances 5, 047118 (2015), an initially transparent light shutter using a polymer-networked LC (PNLC) cell containing patterned electrodes. The authors utilized a LC host mixture having a positive dielectric anisotropy E7 and ($\Delta$ n: 0.223, $\Delta\varepsilon$: 13.5, Merck) together with 5% of UV curable monomers (Bisphenol A dimethacrylate, Sigma-Aldrich). However, these light shutters are produced with a long lasting curing process and costly electrode structures, since they need patterned ITO electrode structures. Moreover, such ITO electrode structures are currently not applicable for plastic substrates.

Basically, the normally transparent PNLC mode has not only considerable potential for flexible display applications or transparent display applications as described above, but it has also considerable potential for smart window applications or privacy window applications, since both applications should be beneficially switched electrically from a transparent "off-state" with no applied electric field to a dark or hazy "on-state".

However, the normally transparent PNLC mode, often suffers from a slow response time because of their reliance on the slow relaxation of the LCs, from high operating voltages because of their helical structure or utilized polymer material, and from an unfavourable low dark level. Especially, an increased dark level is important for the smart window applications. In this regard, for example, an increased dark level can be, achieved by doping dichroic dyes into the utilized LC mixture. However, most of the organic dichroic dyes suffer from the UV curing process, which is mandatory for a PNLC cell and which often, results in an unfavourable decolouration of the utilized dyes.

The attempts to solve the above mentioned requirements of the prior art are connected with several disadvantages such as, for example, an increase of the operational voltage, an unfavourable translucent or opaque state with a low haze level or dark level, an unfavourable transparent state with a high residual haze or unfavourable colouration, a reduction of the switching speed, or unfavourable processing steps, which are especially not compatible with commonly known methods for the mass production of corresponding devices.

Thus, one of the main aims of the invention is to provide an alternative, or preferably improved, LC media for light modulation elements based on the normally transparent PNLC mode and light modulations element operated in the normally transparent PNLC mode, as such, which do not have the drawbacks of the prior art, and preferably exhibit one or more advantages mentioned above and below.

Surprisingly, the inventors have found out that one or more of the above and below defined requirements can be achieved by the present invention according to claim 1.

Other aims of the present invention are immediately evident to the person skilled in the art from the following description.

BRIEF DESCRIPTION

The invention relates to a LC medium comprising, one or more non-polymerisable (low molecular weight) LC compounds, one or more polymerisable LC compounds, one or more carbazole oxime ester photoinitiators, and one or more dichroic dyes.

The invention furthermore relates to a process for the preparation of the LC medium as described above and below comprising the steps of mixing one or more low-molecular-weight LC compounds, one or more polymerisable liquid crystal compounds, and one or more carbazole oxime ester photoinitiators, with one or more dichroic dyes.

The invention furthermore relates to the use of an LC medium as described above and below in a light modulation element based on the normally transparent PNLC mode.

The invention furthermore relates to a light modulation element comprising a LC cell comprising two substrates and an electrode arrangement and a layer of an LC medium as described above and below located between the substrates, characterized in that the polymerisable compounds of the LC medium are polymerized.

The invention furthermore relates to the use a light modulation element as described above and below, in an electro optical device, such as for example a light shutter for an transparent OLED or a window element for a smart window.

Thus, the invention also relates to electro optical devices comprising the light modulation elements as described above and below as such.

The invention furthermore relates to a process for the production of the light modulation element as described above and below in which an LC medium as described above and below, is introduced into an LC cell having two substrates and an electrode structure as described above and below, and the polymerisable LC compounds of the LC medium are polymerised.

Especially, by utilizing the LC media according to the present invention in PNLC light modulation elements operated in the normally transparent mode, the above and below mentioned requirements, amongst others, can be fulfilled, preferably at the same time.

In particular, the light modulation elements exhibit, preferably at the same time,
favourable fast response times,
favourable low voltages required for addressing,
favourable transparent and preferably uncoloured "off states", and
favourable really dark or hazy "on states".

In addition, the light modulation elements can be produced by compatible, commonly known methods for the mass production.

Terms and Definition

Unless explicitly stated otherwise, the following meanings apply above and below:

The terms "liquid crystal", "mesogen" and "mesogenic compound" as used herein mean a compound that under suitable conditions of temperature, pressure and concentration can exist as a mesophase or in particular as a LC phase.

The term "mesogenic group" is known to the person skilled in the art and is described in the literature, and denotes a group which, due to the anisotropy of its attracting and repelling interactions, essentially contributes to causing a liquid-crystal (LC) phase in low-molecular-weight or polymeric substances. Compounds containing mesogenic groups (mesogenic compounds) do not necessarily have to have an LC phase themselves. It is also possible for mesogenic compounds to exhibit LC phase behaviour only after mixing with other compounds and/or after polymerisation. Typical mesogenic groups are, for example, rigid rod- or disc-shaped units. An overview of the terms and definitions used in connection with mesogenic or LC compounds is given in Pure Appl. Chem. 73(5), 888 (2001) and C. Tschierske, G. Pelzl, S. Diele, Angew. Chem. 2004, 116, 6340-6368.

The term "hydrocarbyl group" means any monovalent or multivalent organic radical moiety which comprises at least one carbon atom and optionally one or more H atoms, and optionally one or more hetero atoms like for example N, O, S, P, Si, Se, As, Te or Ge. A hydrocarbyl group comprising a chain of 3 or more C atoms may also be linear, branched and/or cyclic, including spiro and/or fused rings.

Throughout the application, the term "aryl and heteroaryl groups" encompass groups, which can be monocyclic or polycyclic, i.e. they can have one ring (such as, for example, phenyl) or two or more rings, which may also be fused (such as, for example, naphthyl) or covalently linked (such as, for example, biphenyl), or contain a combination of fused and linked rings. Heteroaryl groups contain one or more heteroatoms, preferably selected from O, N, S and Se. Particular preference is given to mono-, bi- or tricyclic aryl groups having 6 to 25 C atoms and mono-, bi- or tricyclic heteroaryl groups having 2 to 25 C atoms, which optionally contain fused rings, and which are optionally substituted. Preference is furthermore given to 5, 6 or 7-membered aryl and heteroaryl groups, in which, in addition, one or more CH groups may be replaced by N, S or O in such a way that O atoms and/or S atoms are not linked directly to one another. Preferred aryl groups are, for example, phenyl, biphenyl, terphenyl, [1,1':3',1"]terphenyl-2'-yl, naphthyl, anthracene, binaphthyl, phenanthrene, pyrene, dihydropyrene, chrysene, perylene, tetracene, pentacene, benzopyrene, fluorene, indene, indenofluorene, spirobifluorene, more preferably 1,4-phenylene, 4,4'-biphenylene, 1, 4-tephenylene.

Preferred heteroaryl groups are, for example, 5 membered rings, such as pyrrole, pyrazole, imidazole, 1,2,3-triazole, 1,2,4-triazole, tetrazole, furan, thiophene, selenophene, oxazole, isoxazole, 1,2 thiazole, 1,3-thiazole, 1,2,3-oxadiazole, 1,2,4 oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6 membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, iso-indole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phen-anthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]-thiophene, dithienothiophene, isobenzothiophene, dibenzothiophene, benzothiadiazothiophene, or combinations of these groups. The heteroaryl groups may also be substituted by alkyl, alkoxy, thioalkyl, fluorine, fluoroalkyl or further aryl or heteroaryl groups.

In the context of this application, the term "(non-aromatic) alicyclic and heterocyclic groups" encompass both saturated rings, i.e. those that contain exclusively single bonds, and partially unsaturated rings, i.e. those that may also contain multiple bonds. Heterocyclic rings contain one or more heteroatoms, preferably selected from Si, O, N, S and Se. The (non-aromatic) alicyclic and heterocyclic groups can be monocyclic, i.e. contain only one ring (such as, for example, cyclohexane), or polycyclic, i.e. contain a plurality of rings (such as, for example, decahydro-naphthalene or bicyclooctane). Particular preference is given to saturated groups. Preference is furthermore given to mono-, bi- or tricyclic groups having 3 to 25 C atoms, which optionally contain fused rings and that are optionally substituted. Preference is furthermore given to 5-, 6-, 7- or 8-membered carbocyclic groups in which, in addition, one or more C atoms may be replaced by Si and/or one or more CH groups may be replaced by N and/or one or more non-adjacent $CH_2$ groups may be replaced by —O— and/or —S—. Preferred alicyclic and heterocyclic groups are, for example, 5-membered groups, such as cyclopentane, tetrahydrofuran, tetrahydrothiofuran, pyrrolidine, 6-membered groups, such as cyclohexane, silinane, cyclohexene, tetrahydropyran, tetrahydrothiopyran, 1,3-dioxane, 1,3-dithiane, piperidine, 7-membered groups, such as cycloheptane, and fused groups, such as tetrahydronaphthalene, decahydronaphthalene, indane, bicyclo[1.1.1]-pentane-1,3-diyl, bicyclo[2.2.2]octane-1,4-diyl, spiro[3.3]heptane-2,6-diyl, octahydro-4,7-methanoindane-2,5-diyl, more preferably 1,4-cyclohexylene 4,4'-bicyclohexylene, 3,17-hexadecahydro-cyclopenta[a]phenanthrene, optionally being substituted by one or more identical or different groups L. Especially preferred aryl-, heteroaryl-, alicyclic- and heterocyclic groups are 1,4-phenylene, 4,4'-biphenylene, 1, 4-terphenylene, 1,4-cyclohexylene, 4,4'-bicyclohexylene, and 3,17-hexadecahydro-cyclopenta[a]-phenanthrene, optionally being substituted by one or more identical or different groups L.

Preferred substituents (L) of the above-mentioned aryl-, heteroaryl-, alicyclic- and heterocyclic groups are, for example, solubility-promoting groups, such as alkyl or alkoxy and electron-withdrawing groups, such as fluorine, nitro or nitrile. Particularly preferred substituents are, for example, F, Cl, CN, $NO_2$, $CH_3$, $C_2H_5$, $OCH_3$, $OC_2H_5$, $COCH_3$, $COC_2H_5$, $COOCH_3$, $COOC_2H_5$, $CF_3$, $OCF_3$, $OCHF_2$ or $OC_2F_5$.

For the present invention,

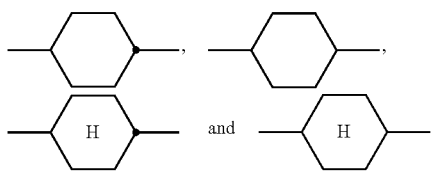

denote trans-1,4-cyclohexylene, and

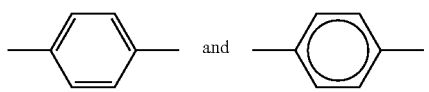

denote 1,4-phenylene.

Above and below "halogen" denotes F, Cl, Br or I.

Above and below, the terms "alkyl", "aryl", "heteroaryl", etc., also encompass polyvalent groups, for example alkylene, arylene, heteroarylene, etc.

The term "aryl" denotes an aromatic carbon group or a group derived there from.

The term "heteroaryl" denotes "aryl" in accordance with the above definition containing one or more heteroatoms.

Preferred alkyl groups are, for example, methyl, ethyl, n propyl, isopropyl, n butyl, isobutyl, s butyl, t butyl, 2 methylbutyl, n pentyl, s pentyl, cyclo-pentyl, n hexyl, cyclohexyl, 2 ethylhexyl, n heptyl, cycloheptyl, n octyl, cyclooctyl, n nonyl, n decyl, n undecyl, n dodecyl, dodecanyl, trifluoro-methyl, perfluoro-n-butyl, 2,2,2-trifluoroethyl, perfluorooctyl, perfluoro-hexyl, etc.

Preferred alkoxy groups are, for example, methoxy, ethoxy, 2-methoxy-ethoxy, n-propoxy, i-propoxy, n-butoxy, i-butoxy, s-butoxy, t-butoxy, 2-methylbutoxy, n-pentoxy, n-hexoxy, n-heptoxy, n-octoxy, n-nonoxy, n-decoxy, n-undecoxy, n-dodecoxy.

Preferred alkenyl groups are, for example, ethenyl, propenyl, butenyl, pentenyl, cyclopentenyl, hexenyl, cyclohexenyl, heptenyl, cycloheptenyl, octenyl, cyclooctenyl.

Preferred alkynyl groups are, for example, ethynyl, propynyl, butynyl, pentynyl, hexynyl, octynyl.

Preferred amino groups are, for example, dimethylamino, methylamino, methylphenylamino, phenylamino.

Above and below "halogen" denotes F, Cl, Br or I.

The term "reactive mesogen", "polymerisable LC compound" or "RM" denotes a compound containing at least one mesogenic group and one or more functional groups, which are suitable for polymerisation (also referred to as polymerisable group or group P as defined below).

The terms "low-molecular-weight LC compound" and "non-polymerisable LC compound" denote compounds, usually monomeric compounds comprising at least one mesogenic group, which contain no functional group, which is suitable for polymerisation under the usual conditions known to the person skilled in the art, in particular under the conditions used for the polymerisation of RMs.

The term "low molecular" preferably means that the relative molecular weight of a compound is less than 2000 g/mol.

"Halogen" denotes F, Cl, Br or I.

Definitions such as "alkyl, alkoxy, alkylcarbonyl, alkoxycarbonyl, alkylcarbonyloxy or alkoxycarbonyloxy having 1 to 12 C atoms", etc., mean that the radicals containing a carbonyl group (CO) and the unsaturated radicals, such as alkenyl and alkynyl, have at least two C atoms, and the branched radicals have at least three C atoms.

A polymerisable group, such as, for example the groups $P^1$, $P^2$, $P^3$, $P^{11}$, etc., is a group which is suitable for a polymerisation reaction, such as, for example, free radical or ionic chain polymerisation, polyaddition or polycondensation, or for a polymer-analogous reaction, for example addition or condensation onto a main polymer chain. Particular preference is given to groups for chain polymerisation, in particular those containing a C=C double bond or —C≡C— triple bond, and groups which are suitable for polymerisation with ring opening, such as, for example, oxetane or epoxide groups.

Preferred polymerizable groups are selected from the group consisting of $CH_2$=$CW^1$—CO—O—, $CH_2$=$CW^1$—CO—,

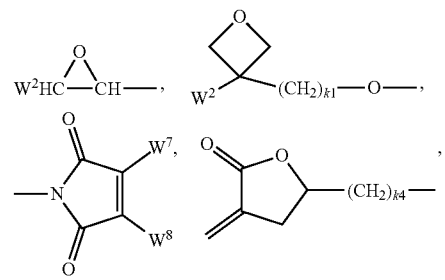

$CH_2=CW^2—(O)_{k3}—$, $CW^1=CH—CO—(O)_{k3}—$, $CW^1=CH—CO—NH—$, $CH_2=CW^1—CO—NH—$, $CH_3—CH=CH—O—$, $(CH_2=CH)_2CH—OCO—$, $(CH_2=CH—CH_2)_2CH—OCO—$, $(CH_2=CH)_2CH—O—$, $(CH_2=CH—CH_2)_2N—$, $(CH_2=CH—CH_2)_2N—CO—$, $HO—CW^2W^3—$, $HS—CW^2W^3—$, $HW^2N—$, $HO—CW^2W^3—NH—$, $CH_2=CW^1—CO—NH—$, $CH_2=CH—(COO)_{k1}$-Phe-$(O)_{k2}—$, $CH_2=CH—(CO)_{k1}$-Phe-$(O)_{k2}—$, Phe-CH=CH—, HOOC—, OCN— and $W^4W^5W^6Si—$, in which $W^1$ denotes H, F, Cl, CN, $CF_3$, phenyl or alkyl having 1 to 5 C atoms, in particular H, F, Cl or $CH_3$, $W^2$ and $W^3$ each, independently of one another, denote H or alkyl having 1 to 5 C atoms, in particular H, methyl, ethyl or n-propyl, $W^4$, $W^5$ and $W^6$ each, independently of one another, denote Cl, oxaalkyl or oxacarbonylalkyl having 1 to 5 C atoms, $W^7$ and $W^8$ each, independently of one another, denote H, Cl or alkyl having 1 to 5 C atoms, Phe denotes 1,4-phenylene, which is optionally substituted by one or more radicals L as defined above which are other than P—Sp—, $k_1$, $k_2$ and $k_3$ each, independently of one another, denote 0 or 1, $k_3$ preferably denotes 1, and $k_4$ denotes an integer from 1 to 10.

Particularly preferred polymerizable groups are selected from the group consisting of $CH_2=CW^1—CO—O—$, $CH_2=CW^1—CO—$,

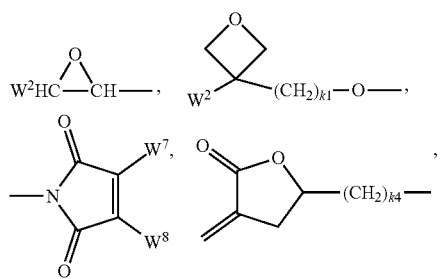

$CH_2=CW^2—O—$, $CW^1=CH—CO—(O)_{k3}—$, $CW^1=CH—CO—NH—$, $CH_2=CW^1—CO—NH—$, $(CH_2=CH)_2CH—OCO—$, $(CH_2=CH—CH_2)_2CH—OCO—$, $(CH_2=CH)_2CH—O—$, $(CH_2=CH—CH_2)_2N—$, $(CH_2=CH—CH_2)_2N—CO—$, $CH_2=CW^1—CO—NH—$, $CH_2=CH—(COO)_{k1}$-Phe-$(O)_{k2}—$, $CH_2=CH—(CO)_{k1}$-Phe-$(O)_{k2}—$, Phe-CH=CH— and $W^4W^5W^6Si—$, in which $W^1$ denotes H, F, Cl, CN, $CF_3$, phenyl or alkyl having 1 to 5 C atoms, in particular H, F, Cl or $CH_3$, $W^2$ and $W^3$ each, independently of one another, denote H or alkyl having 1 to 5 C atoms, in particular H, methyl, ethyl or n-propyl, $W^4$, $W^5$ and $W^6$ each, independently of one another, denote Cl, oxaalkyl or oxacarbonylalkyl having 1 to 5 C atoms, $W^7$ and $W^8$ each, independently of one another, denote H, Cl or alkyl having 1 to 5 C atoms, Phe denotes 1,4-phenylene, $k_1$, $k_2$ and $k_3$ each, independently of one another, denote 0 or 1, $k_3$ preferably denotes 1, and $k_4$ denotes an integer from 1 to 10.

Very particularly preferred polymerizable groups are selected from the group consisting of $CH_2=CW^1—CO—O—$, in particular $CH_2=CH—CO—O—$, $CH_2=C(CH_3)—CO—O—$ and $CH_2=CF—CO—O—$, furthermore $CH_2=CH—O—$, $(CH_2=CH)_2CH—O—CO—$, $(CH_2=CH)_2CH—O—$,

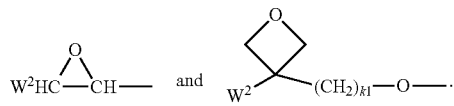

Further very particularly preferred polymerizable groups are selected from the group consisting of vinyloxy, acrylate, methacrylate, fluoroacrylate, chloroacrylate, oxetane and epoxide groups, and particularly preferably denote an acrylate or methacrylate group.

The term "spacer group" or "spacer", also referred to as "Sp" above and below, is known to the person skilled in the art and is described in the literature, see, for example, Pure Appl. Chem. 73(5), 888 (2001) and C. Tschierske, G. Pelzl, S. Diele, Angew. Chem. 2004, 116, 6340-6368. Unless indicated otherwise, the term "spacer group" or "spacer" above and below denotes a flexible group, which connects the mesogenic group, and the polymerisable group(s) to one another in a polymerisable mesogenic compound.

Preferred spacer groups $Sp^{a,b}$ are selected from the formula Sp'-X', so that the radical $P^{a/b}$-$Sp^{a/b}$- conforms to the formula $P^{a/b}$-Sp'-X'—, where Sp' denotes alkylene having 1 to 20, preferably 1 to 12, C atoms, which is optionally mono- or polysubstituted by F, Cl, Br, I or CN, and in which, in addition, one or more non-adjacent $CH_2$ groups may each be replaced, independently of one another, by —O—, —S—, —NH—, —N($R^0$)—, —Si($R^{00}R^{000}$), —CO—, —CO—O—, —O—CO—, —O—CO—O—, —S—CO—, —CO—S—, —N($R^{00}$)—CO—O—, —O—CO—N($R^{00}$)—, —N($R^{00}$)—CO—N($R^{00}$)—, —CH=CH— or —C≡C— in such a way that O and/or S atoms are not linked directly to one another, preferably —$(CH_2)_{p1}$—, —$(CH_2CH_2O)_{q1}$—$CH_2CH_2$—, —$CH_2CH_2$—S—$CH_2CH_2$—, —$CH_2CH_2$—NH—$CH_2CH_2$— or —$(SiR^{00}R^{00}$—O$)_{p1}$—, in which p1 is an integer from 1 to 12, q1 is an integer from 1 to 3, X' denotes —O—, —S—, —CO—, —CO—O—, —O—CO—, —O—CO—O—, —CO—N($R^{00}$)—, —N($R^{00}$)—CO—, —N($R^{00}$)—CO—N($R^{00}$)—, —OCH$_2$—, —CH$_2$O—, —SCH$_2$—, —CH$_2$S—, —CF$_2$O—, —OCF$_2$—, —CF$_2$S—, —SCF$_2$—, —CF$_2$CH$_2$—, —CH$_2$CF$_2$—, —CF$_2$CF$_2$—, —CH=N—, —N=CH—, —N=N—, —CH=CR$^0$—, —CY$^2$=CY$^3$—, —C≡C—, —CH=CH—CO—O—, —O—CO—CH=CH— or a single bond, preferably —O—, —S—, —CO—, —COO—, —OCO—, —O—COO—, —CO—NR$^0$—, —NR$^0$—CO—, —NR$^0$—CO—NR$^0$— or a single bond.

$R^0$ and $R^{00}$ each, independently of one another, denote H or alkyl having 1 to 12 C atoms, and $Y^2$ and $Y^3$ each, independently of one another, denote H, F, Cl or CN.

Particularly preferred groups Sp' are, for example, in each case straight-chain ethylene, propylene, butylene, pentylene, hexylene, heptylene, octylene, nonylene, decylene, undecylene, dodecylene, octadecylene, ethyleneoxyethylene, methyleneoxybutylene, ethylenethioethylene, ethylene-N-methyliminoethylene, 1-methylalkylene, ethenylene, propenylene and butenylene.

Particularly preferred groups -Sp'-X'- are —$(CH_2)_{p1}$—, —$(CH_2)_{p1}$—O—, —$(CH_2)_{p1}$—O—CO—, —$(CH_2)_{p1}$—O—CO—O—, in which p1 and q1 have the meanings indicated above.

The term "polymerisation" means the chemical process to form a polymer by bonding together multiple polymerisable units or polymer precursors containing such polymerisable units.

The term "polymer" means a long or larger molecule consisting of a chain or network of many repeating units, formed by chemically bonding together many small molecules called monomers. A polymer is formed by polymerization, the joining of many monomer molecules or polymer precursors.

A "polymer network" is a network in which all polymer chains are interconnected to form a single macroscopic entity by many crosslinks. The polymer network can occur in the following types:

A graft polymer molecule is a branched polymer molecule in which one or more the side chains are different, structurally or configurationally, from the main chain.

A star polymer molecule is a branched polymer molecule in which a single branch point gives rise to multiple linear chains or arms. If the arms are identical, the star polymer molecule is said to be regular. If adjacent arms are composed of different repeating subunits, the star polymer molecule is said to be variegated.

A comb polymer molecule consists of a main chain with two or more three-way branch points and linear side chains. If the arms are identical, the comb polymer molecule is said to be regular.

A brush polymer molecule consists of a main chain with linear, unbranched side chains and where one or more of the branch points has four-way functionality or larger.

The term "alignment" or "orientation" relates to alignment (orientation ordering) of anisotropic units of material such as small molecules or fragments of big molecules in a common direction named "alignment direction". In an aligned layer of liquid-crystalline material, the liquid-crystalline director coincides with the alignment direction so that the alignment direction corresponds to the direction of the anisotropy axis of the material.

The term "planar orientation/alignment", for example in a layer of an liquid-crystalline material, means that the long molecular axes (in case of calamitic compounds) or the short molecular axes (in case of discotic compounds) of a proportion of the liquid-crystalline molecules are oriented substantially parallel (about 180°) to the plane of the layer.

The term "homeotropic orientation/alignment", for example in a layer of a liquid-crystalline material, means that the long molecular axes (in case of calamitic compounds) or the short molecular axes (in case of discotic compounds) of a proportion of the liquid-crystalline molecules are oriented at an angle θ ("tilt angle") between about 80° to 90° relative to the plane of the layer.

The wavelength of light generally referred to in this application is 550 nm, unless explicitly specified otherwise.

The birefringence Δn herein is defined in the following equation $$\Delta n = n_e - n_o$$

wherein $n_e$ is the extraordinary refractive index and $n_o$ is the ordinary refractive index, and the average refractive index $n_{av.}$ is given by the following equation.

$$n_{av.} = [(2 n_o^2 + n_e^2)/3]^{1/2}$$

The extraordinary refractive index $n_e$ and the ordinary refractive index $n_o$ can be measured using an Abbe refractometer, Δn can then be calculated.

In the present application the term "dielectrically positive" is used for compounds or components with Δε>3.0, "dielectrically neutral" with −1.5≤Δε≤3.0 and "dielectrically negative" with Δε<−1.5. Δε is determined at a frequency of 1 kHz and at 20° C. The dielectric anisotropy of the respective compound is determined from the results of a solution of 10 of the respective individual compound in a nematic host mixture. In case the solubility of the respective compound in the host medium is less than 10% its concentration is reduced by a factor of 2 until the resultant medium is stable enough at least to allow the determination of its properties. Preferably, the concentration is kept at least at 5%, however, in order to keep the significance of the results as high as possible. The capacitance of the test mixtures are determined both in a cell with homeotropic and with homogeneous alignment. The cell gap of both types of cells is approximately 20 μm. The voltage applied is a rectangular wave with a frequency of 1 kHz and a root mean square value typically of 0.5 V to 1.0 V, however, it is always selected to be below the capacitive threshold of the respective test mixture.

Δε is defined as $(\varepsilon_\| - \varepsilon_\perp)$, whereas $\varepsilon_{av.}$ is $(\varepsilon_\| + 2\varepsilon_\perp)/3$.

The following abbreviations are used to illustrate the liquid crystalline phase behavior of the compounds and or mixtures: K=crystalline; N=nematic; S=smectic; Ch=cholesteric; I=isotropic; Tg=glass transition. The numbers between the symbols indicate the phase transition temperatures in ° C.

All physical properties are and have been determined in accordance with "Merck Liquid Crystals, Physical Properties of Liquid Crystals", Status November 1997, Merck KGaA, Germany, and apply for a temperature of 20° C., and Δn is determined at 589 nm and Δε at 1 kHz, unless explicitly indicated otherwise in each case.

Throughout the description and claims of this specification, the words "comprise" and "contain" and variations of the words, for example "comprising" and "comprises", mean "including but not limited to", and are not intended to (and do not) exclude other components. On the other hand, the word "comprise" also encompasses the term "consisting of" but is not limited to it.

All concentrations are quoted in percent by weight (% wt.) and relate to the respective mixture as a whole, all temperatures are quoted in degrees Celsius and all temperature differences are quoted in differential degrees.

DETAILED DESCRIPTION

In a preferred embodiment, the LC media according to the present invention comprises one or more non-polymerisable LC compounds, which form the liquid crystalline component of the LC medium that has preferably a nematic liquid-crystal phase. Said liquid-crystalline component preferably consists of several compounds, preferably of 2 to 30, more preferably of 3 to 20 and most preferably of 4 to 16 non-polymerisable LC compounds.

Preferably, the liquid crystalline component comprises one or more unpolymerisable LC compounds selected from compounds indicated below:

The liquid-crystalline component preferably comprises one or more compounds selected from the group of the compounds of the formulae I-1, I-2, I-3 and I-4,

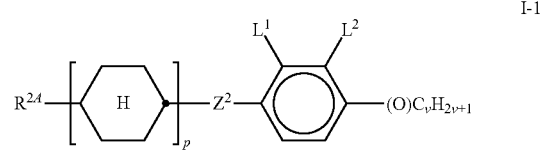

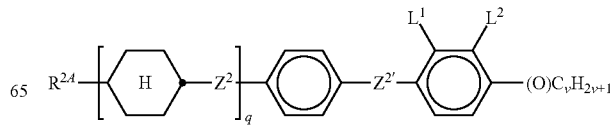

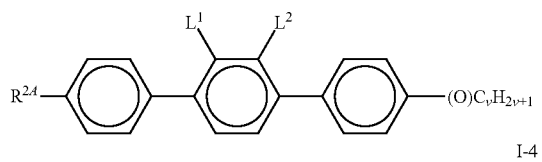
I-3

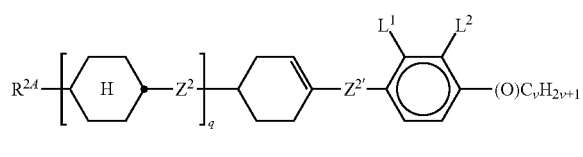
I-4 in which
R$^{2A}$ denotes H, an alkyl or alkoxy radical having 1 to 15 C atoms, where, in addition, one or more CH$_2$ groups in these radicals may each be replaced, independently of one another, by —C≡C—, —CF$_2$O—, —CH=CH—,

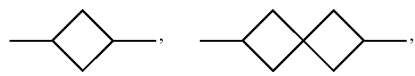

—O—, —CO—O— or —O—CO— in such a way that O atoms are not linked directly to one another, and in which, in addition, one or more H atoms may be replaced by halogen,
L$^1$ and L$^2$ each, independently of one another, denote F, Cl, CF$_3$ or CHF$_2$, preferably each denote F,
Z$^2$ and Z$^{2'}$ each, independently of one another, denote a single bond, —CH$_2$CH$_2$—, —CH=CH—, —CF$_2$O—, —OCF$_2$—, —CH$_2$O—, —OCH$_2$—, —COO—, —OCO—, —C$_2$F$_4$—, —CF=CF— or —CH=CHCH$_2$O—,
p denotes 0, 1 or 2,
q denotes 0 or 1,
(O)C$_v$H$_{2v+1}$ denotes OC$_v$H$_{2v+1}$ or C$_v$H$_{2v+1}$, and
v denotes 1 to 6.
Particularly preferred compounds of the formulae I-1 to I-4 are shown below:

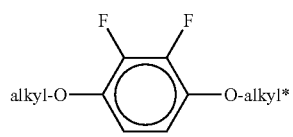
I-1a

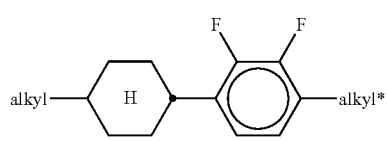
I-1b

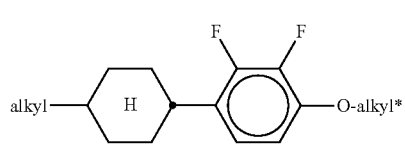
I-1c

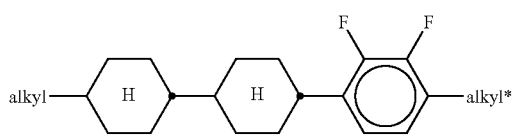
I-1d

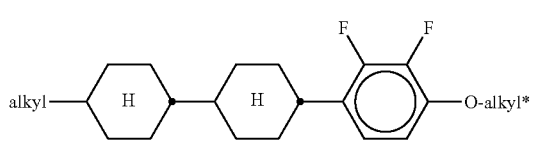
I-1e

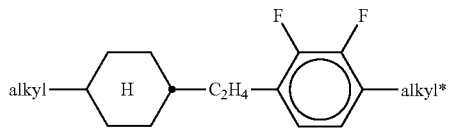
I-1f

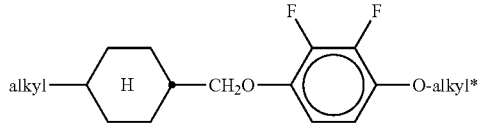
I-1g

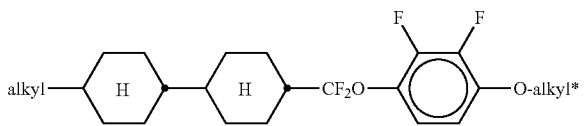
I-1h

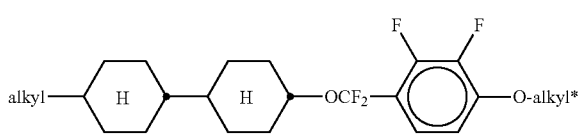
I-1i

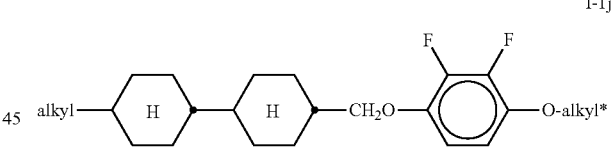
I-1j

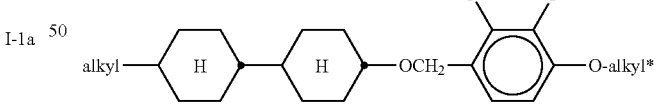
I-1k

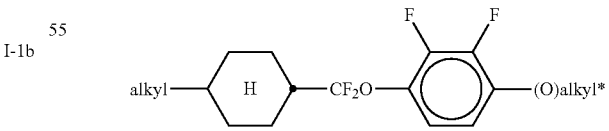
I-1l

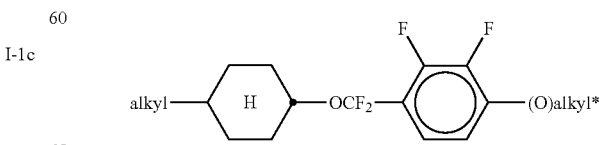
I-1m

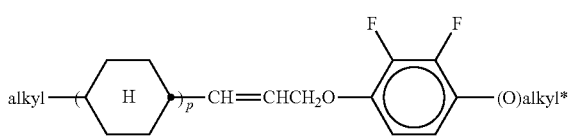
I-1n
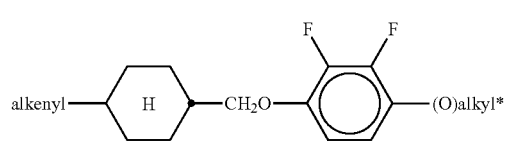
I-1o
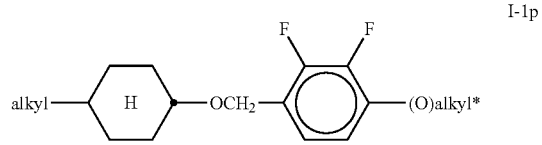
I-1p
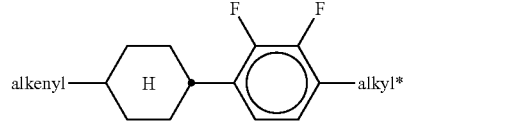
I-1q
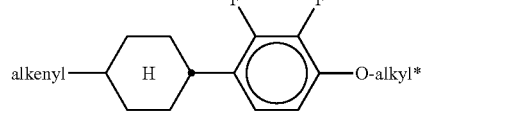
I-1r
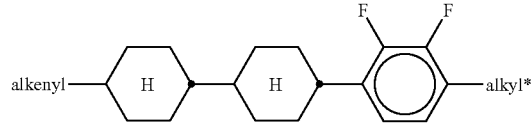
I-1s
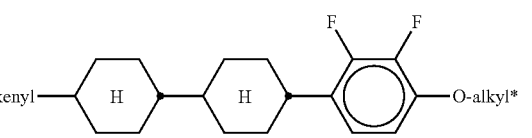
I-1t
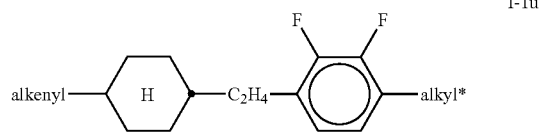
I-1u
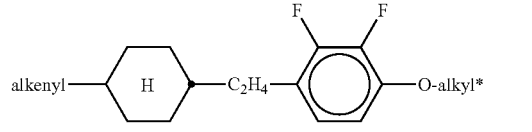
I-1v
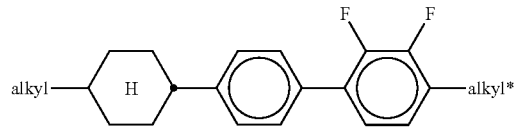
I-2a
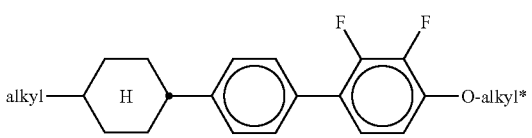
I-2b
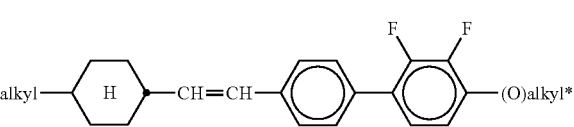
I-2c
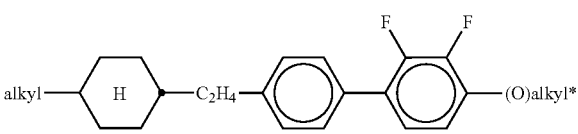
I-2d
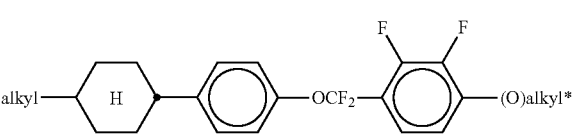
I-2e
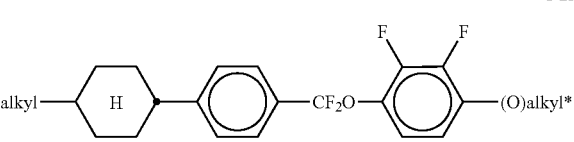
I-2f
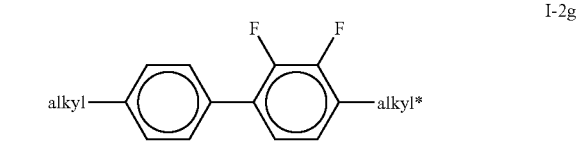
I-2g
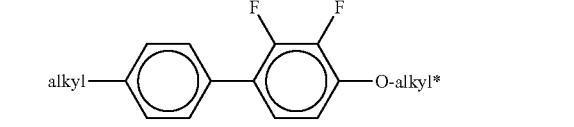
I-2h
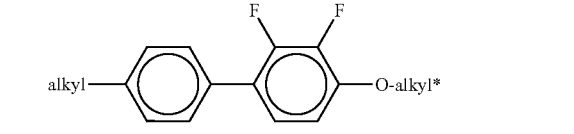
I-2h
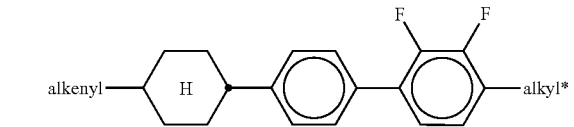
I-2i
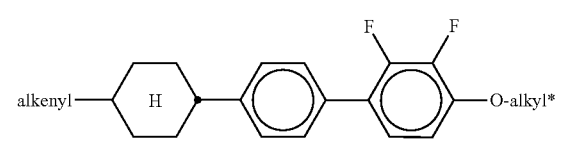
I-2j -continued I-3a
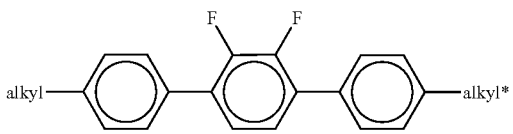

in which
alkyl and alkyl* each, independently of one another, denote a straight-chain alkyl radical having 1 to 9 C atoms, preferably 2 to 6 C atoms, and alkenyl and alkenyl* each, independently of one another, denote a straight-chain alkenyl radical having 2-6 C atoms, and p denotes 0, 1 or 2.

Of the said compounds, particular preference is given to the compounds of the formulae I-1a, I-1c, I-1e, I-1g, I-1j, I-1r, I-1t, I-2b, I-2h, I-2j and I-3a.

the medium comprises one or more neutral compounds of the formulae II and/or III, II
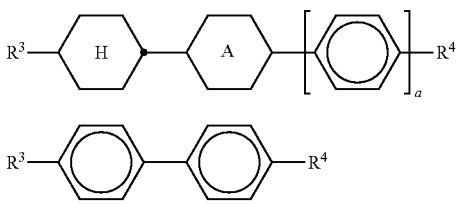

III
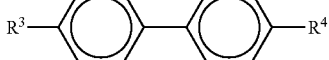

in which
A denotes 1,4-phenylene or trans-1,4-cyclohexylene,
a is 0 or 1,
$R^3$ denotes alkenyl having 2 to 9 C atoms, and
$R^4$ denotes an alkyl or alkoxy radical having 1 to 15 C atoms, where, in addition, one or more $CH_2$ groups in these radicals may each be replaced, independently of one another, by —C≡C—, —$CF_2$O—, —CH=CH—,

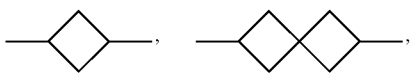

—O—, —CO—O—, —O—CO— in such a way that O atoms are not linked directly to one another, and in which, in addition, one or more H atoms may be replaced by halogen, preferably alkyl having 1 to 12 C atoms or alkenyl having 2 to 9 C atoms.

The compounds of the formula II are preferably selected from the following formulae:

IIa
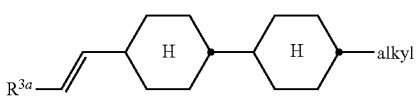

IIb
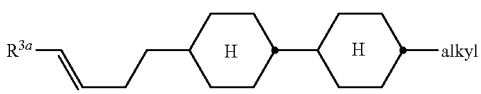

IIc
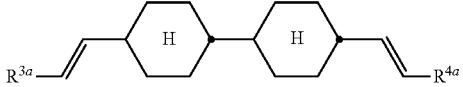

IId
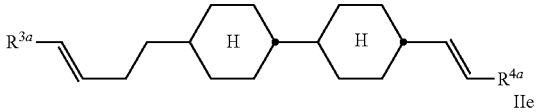

IIe
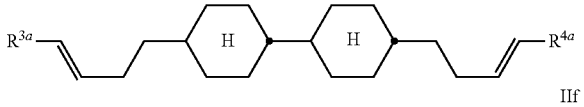

IIf
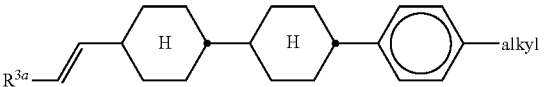

IIg
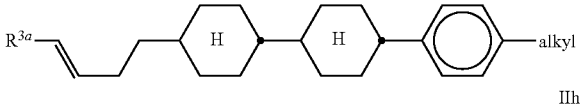

IIh
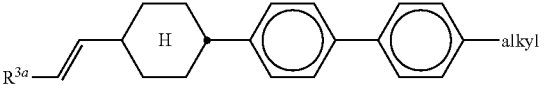

IIi
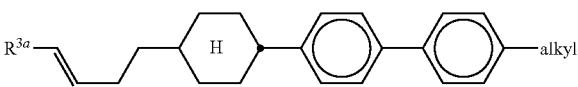

in which $R^{3a}$ and $R^{4a}$ each, independently of one another, denote H, $CH_3$, $C_2H_5$ or $C_3H_7$, and "alkyl" denotes a straight-chain alkyl group having 1 to 8 C atoms. Particular preference is given to compounds of the formulae IIa and IIf, in particular, in which $R^{3a}$ denotes H or $CH_3$, and compounds of the formula IIc, in particular in which $R^{3a}$ and $R^{4a}$ denote H, $CH_3$ or $C_2H_5$.

Preference is furthermore given to compounds of the formula II which have a non-terminal double bond in the alkenyl side chain:

IIj
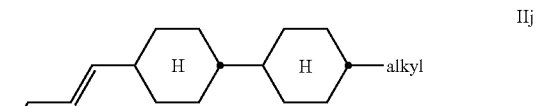

IIk
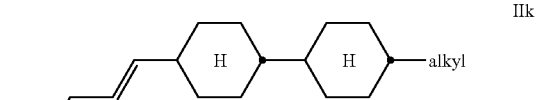

IIl
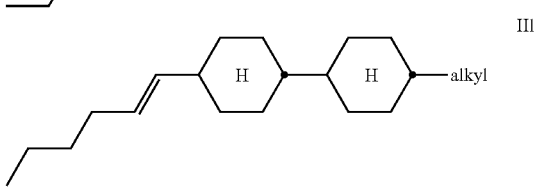

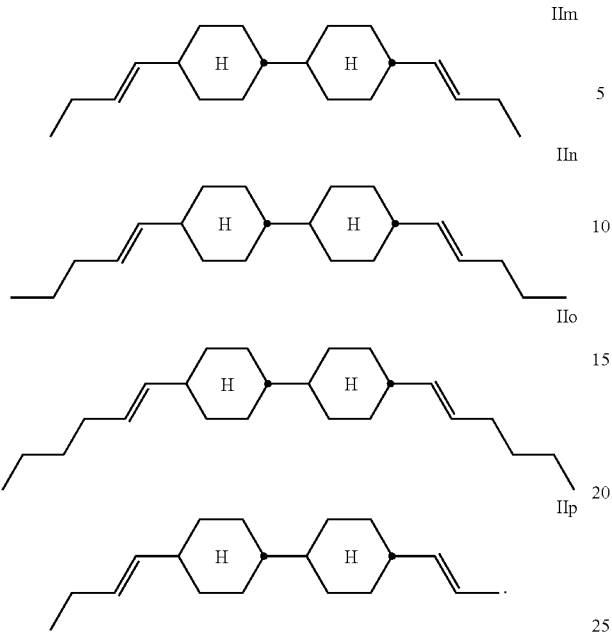
Very particularly preferred compounds of the formula II are the compounds of the formulae
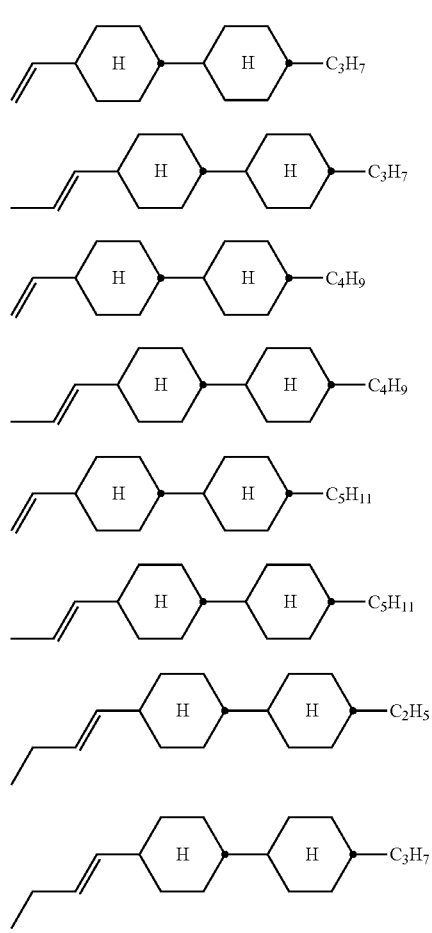
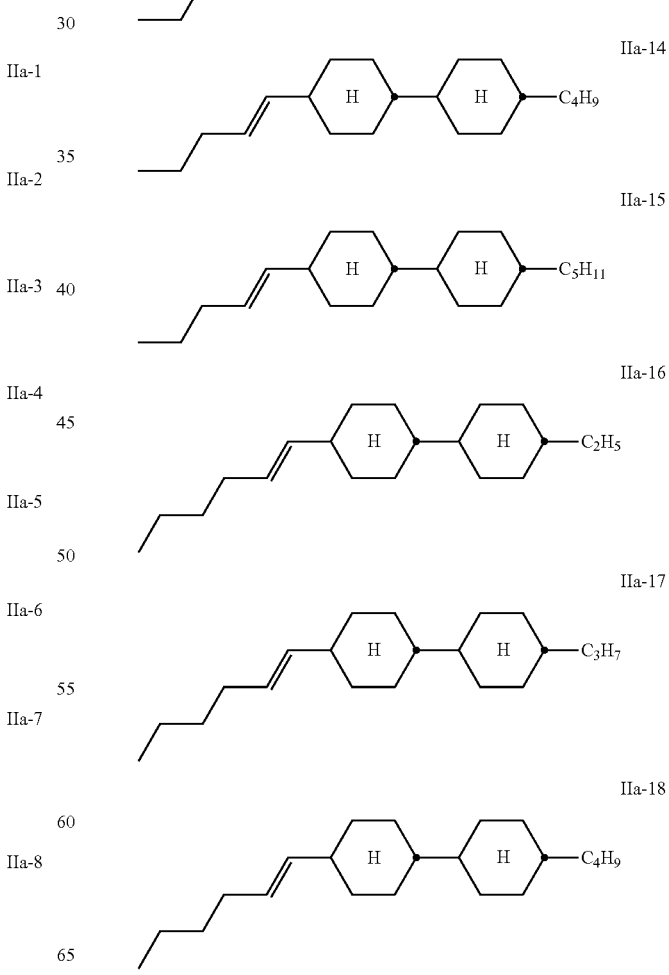

IIa-19

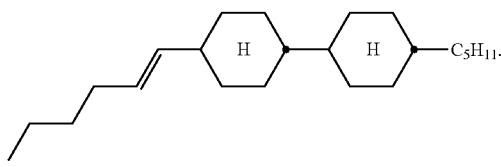

Of the compounds of the formulae IIa-1 to IIa-19, particular preference is given, in particular, to the compounds of the formulae IIa-1, IIa-2, IIa-3 and IIa-5.

The compounds of the formula III are preferably selected from the following formulae:

IIIa

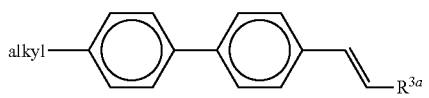

IIIb

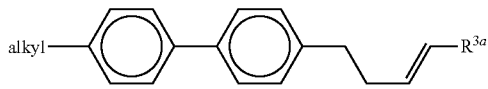

in which "alkyl" and $R^{3a}$ have the meanings indicated above, and $R^{3a}$ preferably denotes H or $CH_3$. Particular preference is given to compounds of the formula IIIb;

Very particular preference is given to the compound of the formula IIIb-1,

IIIb-1

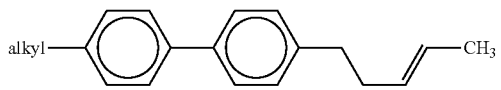

in which "alkyl" has the meaning indicated above and preferably denotes $CH_3$, furthermore $C_2H_5$ or $n-C_3H_7$.

Preferred mixtures comprise at least one compound from the group S-1, S-2, S-3 and S-4,

S-1

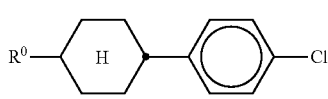

S-2

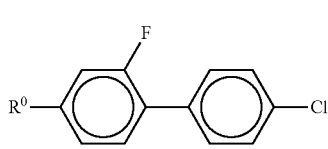

S-3

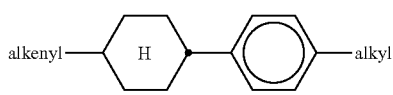

S-4

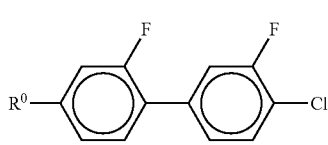

since these compounds help, inter alia, to suppress the smectic phases of the mixtures.

The liquid-crystalline component preferably comprises one or more compounds of the general formula N,

N

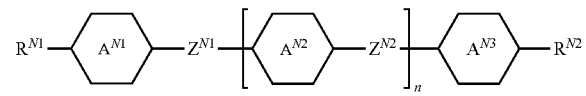

in which $R^{N1}$ and $R^{N2}$ each, independently of one another, denote an alkyl or alkoxy radical having 1 to 15 C atoms, where, in addition, one or more $CH_2$ groups in these radicals may each be replaced, independently of one another, by —C≡C—, —$CF_2$O—,

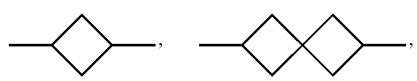

—O—, —CO—O—, —O—CO— in such a way that O atoms are not linked directly to one another, and in which, in addition, one or more H atoms may be replaced by halogen, rings $A^{N1}$, $A^{N2}$, and $A^{N3}$ each, independently of one another, denote 1,4-phenylene, 2-fluoro-1,4-phenylene, 3-fluoro-1,4-phenylene, trans-1,4-cyclohexylene, in which, in addition, one or two $CH_2$ groups may be replaced by —O—, or 1,4-cyclohexenylene, $Z^{N1}$ and $Z^{N2}$ each, independently of one another, denote a single bond, —$CH_2CH_2$—, —COO—, —OCO—, —C≡C—, —$CH_2$O—, —O$CH_2$—, —$CF_2$O—, —OCF$_2$— or —CH=CH—, n denotes 0, 1 or 2.

Preferred compounds of the formula N are shown below:

N-1

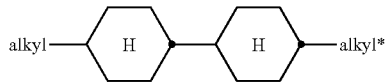

N-2

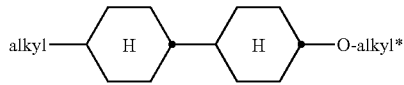

N-3

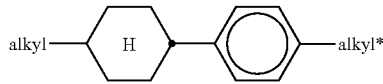

N-4

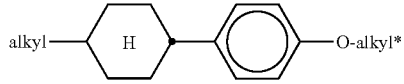

N-5

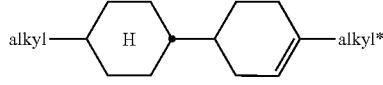

N-6

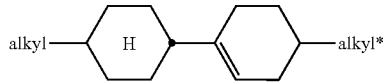

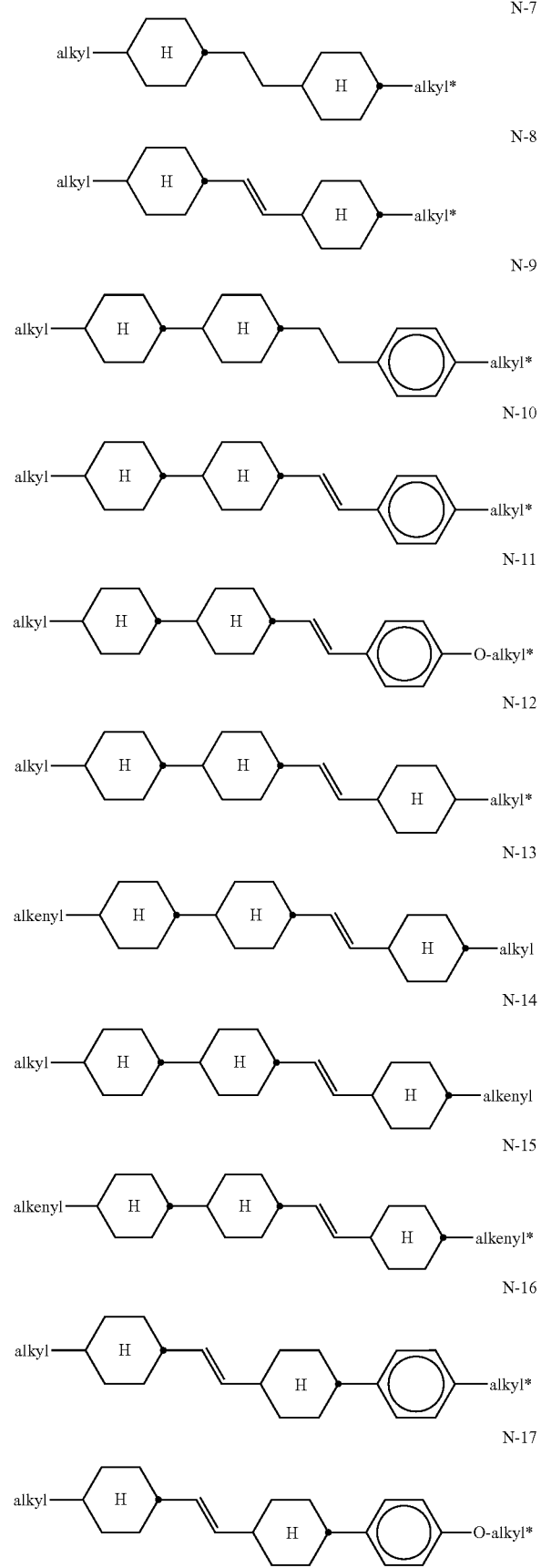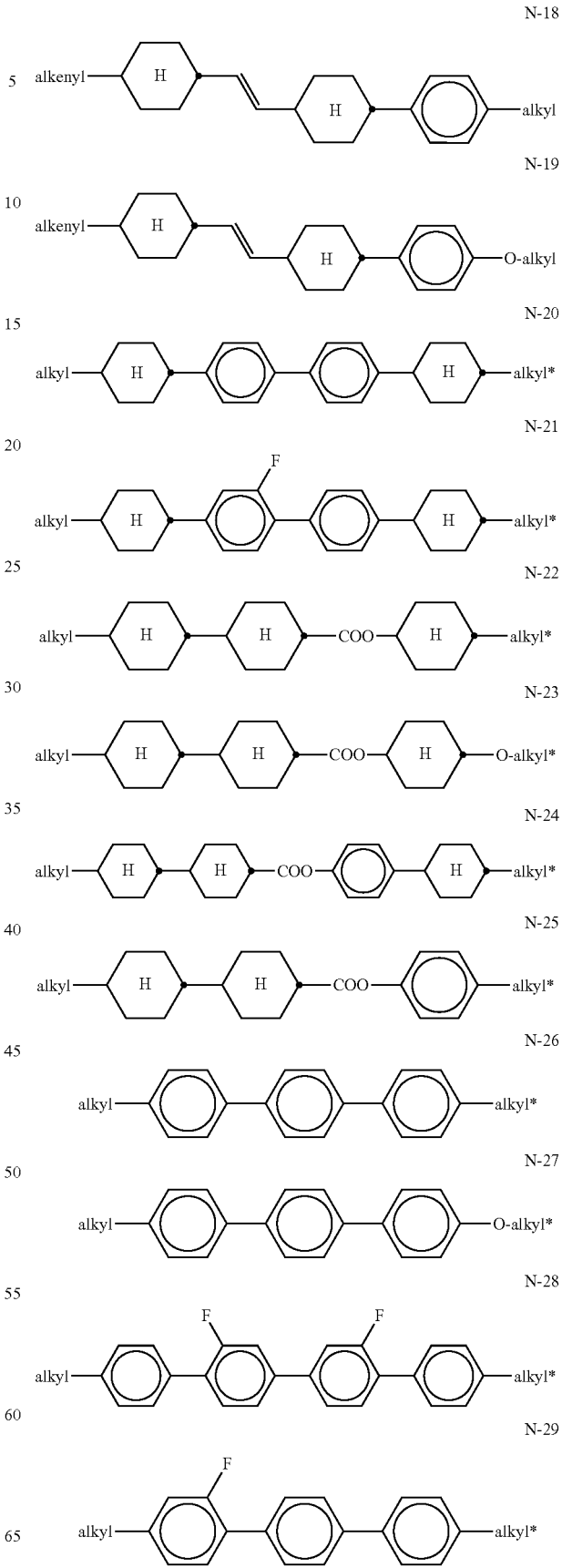

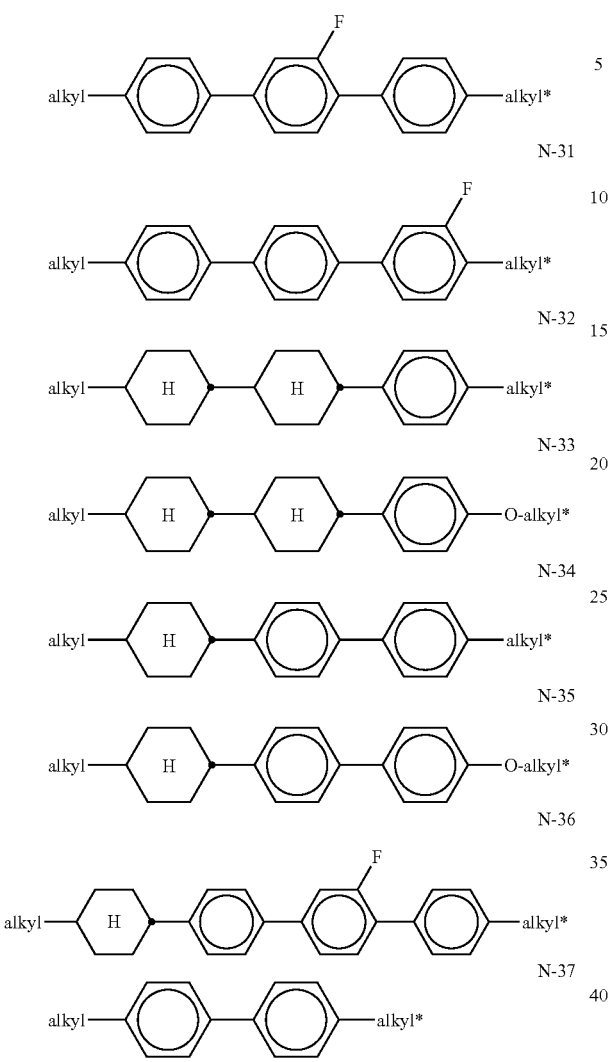

in which
alkyl and alkyl* each, independently of one another, denote a straight-chain alkyl radical having 1 to 9 C atoms, preferably 2 to 6 C atoms, and alkenyl and alkenyl* each, independently of one another, denote a straight-chain alkenyl radical having 2-6 C atoms.

Of the compounds of the formula N, particular preference is given to the compounds of the formulae N-1, N-2, N-3, N-4, N-8, N-9, N-14, N-15, N-17, N-18, N-19, N-20, N-21, N-22, N-23, N-24, N-25, N-30, N-32, N-34 and N-37.

The compounds of the formulae I to III, and N or the sub-formulae thereof can be prepared analogously to processes known to the person skilled in the art and described in standard works of organic chemistry, such as, for example, in Houben-Weyl, Methoden der organischen Chemie [Methods of Organic Chemistry], Thieme-Verlag, Stuttgart.

Preferred compounds, which can be employed in a liquid-crystalline medium according to the invention are indicated below:

the medium preferably comprises one or more compounds of the formula I-1, preferably of the formula I-1c, selected from the group of the compounds of the formulae CY-3-O2, CY-3-O4, CY-5-O2 and CY-5-O4, the medium preferably comprises one or more compounds of the formula I-1, preferably selected from the group of the compounds of the formulae I-1e and I-1d, preferably of the formula CCY-n-Om, preferably selected from the group of the compounds of the formulae CCY-3-O2, CCY-2-O2, CCY-3-O1, CCY-3-O3, CCY-4-O2, CCY-3-O2 and CCY-5-O2, the medium preferably comprises one or more compounds of the formula I-2, preferably of the formula I-2b, preferably selected from the group of the compounds of the formulae CPY-2-O2, CPY-3-O2, CPY-4-O2 and CPY-5-O2, the medium preferably comprises one or more compounds of the formula I-2h, preferably selected from the group of the compounds of the formulae PY-3-O2, PY-1-O4 and PY-4-O2, the medium preferably comprises one or more compounds of the formula I-3, preferably selected from the group of the compounds of the formulae PYP-2-3 and PYP-2-4, the medium preferably optionally comprises one or more compounds of the formula I-4, preferably of the formula CLY-n-Om, preferably selected from the group of the compounds of the formulae CLY-2-O4, CLY-3-O2 and CLY-3-O3, the medium preferably comprises one or more compounds of the formula II, preferably selected from the group of the compounds of the formulae CC-n-V and CC-n-Vm, preferably CC-3-V, CC-3-V1, CC-4-V and CC-5-V, particularly preferably selected from the group of the compounds CC-3-V, CC-3-V1 and CC-4-V, very particularly preferably the compound CC-3-V, and optionally additionally the compound CC-4-V and/or CC-3-V1, the medium preferably comprises the compound PP-1-2V1, the medium preferably comprises compounds of the formulae I-1 to I-4 in an amount of 20 to 99% by weight in the mixture as a whole, the medium preferably comprises 1% by weight or more to 60% by weight or less, preferably 3% by weight or more to 50% by weight or less, particularly preferably 5% by weight or more to 45% by weight or less, of compounds of the formulae II and/or III, the medium preferably comprises 45% by weight or more to 80% by weight or less of compounds of the formulae I-1 to I-4, the medium preferably comprises 10% by weight or more to 40% by weight or less of compounds of the formula I-1, the medium preferably comprises 10% by weight or more to 40% by weight or less of compounds of the formula I-2, the medium preferably comprises 10% by weight or more to 40% by weight or less of compounds of the formula I-3, the medium preferably comprises 0% by weight or more to 40% by weight or less of compounds of the formula I-4.

In a further preferred embodiment, the polymerisable LC compounds are preferably selected from the group of compounds of the following formula M:

$$P^1\text{-}Sp^1\text{-}A^2\text{-}(Z^1\text{-}A^1)_n\text{-}Sp^2\text{-}P^2 \qquad M$$

in which,

P¹, P² each, independently of one another, denote a polymerisable group,

Sp¹, Sp² on each occurrence, identically or differently, denote a spacer group or a single bond, where one or more of the groups P¹-Sp¹-, -Sp²-P² may denote a radical R$^{aa}$, with the proviso that at least one of the groups P¹-Sp¹-, -Sp²-P² does not denote R$^{aa}$, A¹, A² each, independently of one another, denote a radical selected from the following groups:

a) the group consisting of trans-1,4-cyclohexylene, 1,4-cyclohexenylene and 4,4'-bicyclohexylene, in which, in addition, one or more non-adjacent CH₂ groups may be replaced by —O— and/or —S— and in which, in addition, one or more H atoms may be replaced by a group L, or a radical of the formula

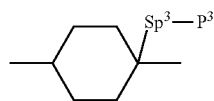

b) the group consisting of 1,4-phenylene and 1,3-phenylene, in which, in addition, one or two CH groups may be replaced by N and in which, in addition, one or more H atoms may be replaced by a group L or —Sp³-P, c) the group consisting of tetrahydropyran-2,5-diyl, 1,3-dioxane-2,5-diyl, tetrahydrofuran-2,5-diyl, cyclobutane-1,3-diyl, piperidine-1,4-diyl, thiophene-2,5-diyl and selenophene-2,5-diyl, each of which may also be mono- or polysubstituted by L, d) the group consisting of saturated, partially unsaturated or fully unsaturated, and optionally substituted, polycyclic radicals having 5 to 20 cyclic C atoms, one or more of which may, in addition, be replaced by heteroatoms, preferably selected from the group consisting of bicyclo[1.1.1]-pentane-1,3-diyl, bicyclo[2.2.2]octane-1,4-diyl, spiro[3.3]-heptane-2,6-diyl,

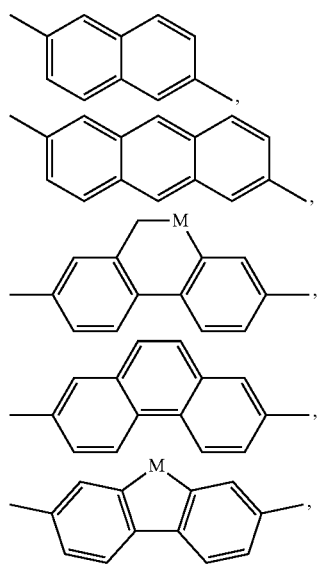

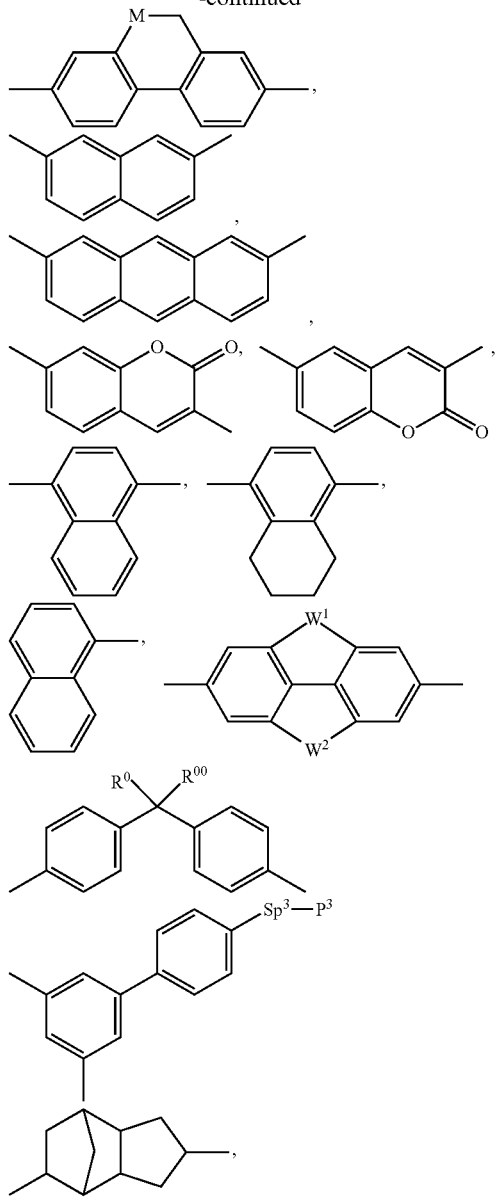

where, in addition, one or more H atoms in these radicals may be replaced by a group L or —Sp³-P, and/or one or more double bonds may be replaced by single bonds, and/or one or more CH groups may be replaced by N, P³ denotes a polymerisable group, Sp³ denotes a spacer group, where one or more of the groups —Sp³-P³ may denote a radical R$^{aa}$, n denotes 0, 1, 2 or 3, preferably 1 or 2, Z¹ in each case, independently of one another, denotes —CO—O—, —O—CO—, —CH₂O—, —OCH₂—, —CF₂O—, —OCF₂—, or —(CH₂)$_n$—, where n is 2, 3 or 4, —O—, —CO—, —C(R$^c$R$^d$)—, —CH₂CF₂—, —CF₂CF₂— or a single bond, L on each occurrence, identically or differently, denotes F, Cl, CN, SCN, SF₅ or straight-chain or branched, in each case optionally mono- or polyfluorinated alkyl, alkoxy, alkenyl, alkynyl, alkylcarbonyl, alkoxycarbonyl, alkylcarbonyloxy or alkoxycarbonyloxy having 1 to 12 C atoms, $R^0$, $R^{00}$ each, independently of one another, denote H, F or straight-chain or branched alkyl having 1 to 12 C atoms, in which, in addition, one or more H atoms may be replaced by F, M denotes —O—, —S—, —CH$_2$—, —CHY$^1$— or —CY$^1$Y$^2$—, and $Y^1$ and $Y^2$ each, independently of one another, have one of the meanings indicated above for $R^0$ or denote Cl or CN, and preferably H, F, Cl, CN, OCF$_3$ or CF$_3$, $W^1$, $W^2$ each, independently of one another, denote —CH$_2$CH$_2$—, —CH=CH—, —CH$_2$—O—, —O—CH$_2$—, —C(R$^c$R$^d$)— or —O—, $R^c$ and $R^d$ each, independently of one another, denote H or alkyl having 1 to 6 C atoms, preferably H, methyl or ethyl.

$R^{aa}$ denotes H, F, Cl, CN or straight-chain or branched alkyl having 1 to 25 C atoms, in which, in addition, one or more non-adjacent CH$_2$ groups may each be replaced, independently of one another, by C(R$^0$)=C(R$^{00}$)—, —C≡C—, —O—, —S—, —CO—, —CO—O—, —O—CO—, —O—CO—O— in such a way that O and/or S atoms are not linked directly to one another, and in which, in addition, one or more H atoms may be replaced by F, Cl, CN or P$^1$-Sp$^1$-, particularly preferably straight-chain or branched, optionally mono- or polyfluorinated alkyl, alkoxy, alkenyl, alkynyl, alkylcarbonyl, alkoxycarbonyl or alkylcarbonyloxy having 1 to 12 C atoms (where the alkenyl and alkynyl radicals contain at least two C atoms and the branched radicals contain at least three C atoms), where the groups —OH, —NH$_2$, —SH, —NHR, —C(O)OH and —CHO are not present in R$^{aa}$.

Further preferred polymerisable LC compounds are selected, for example, from the following formulae:

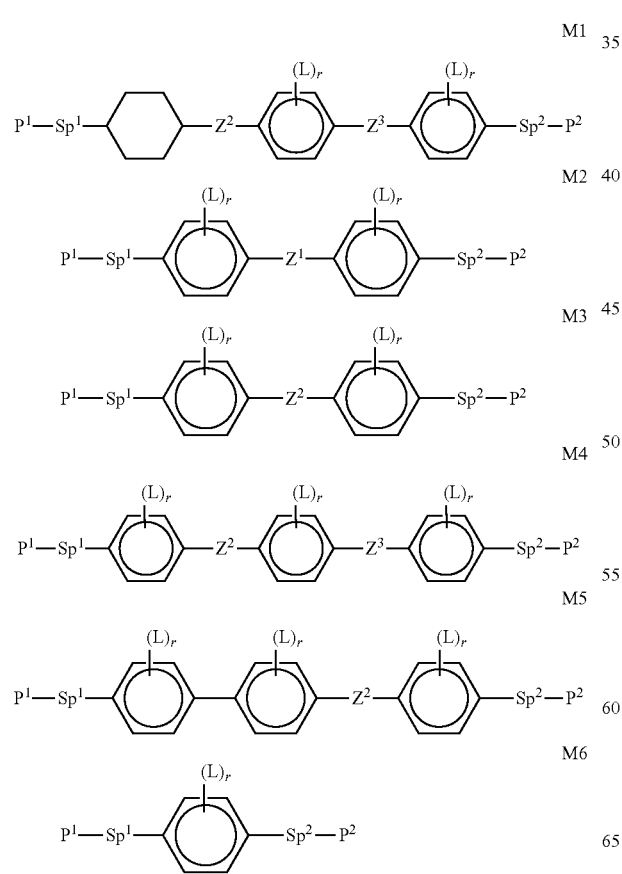
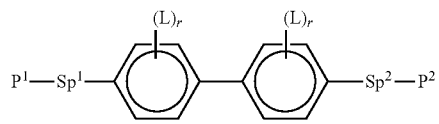
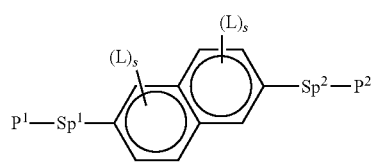
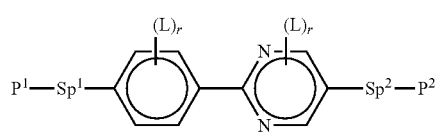
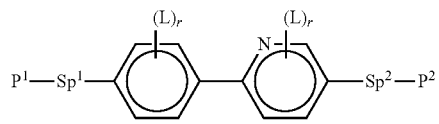
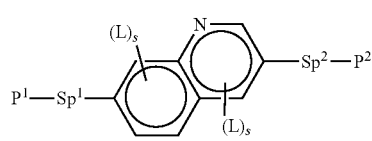
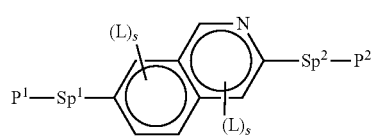
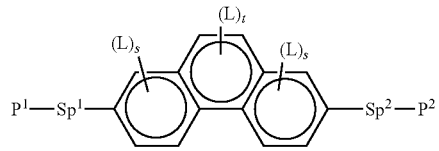
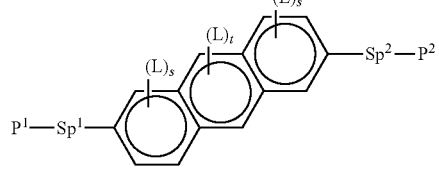
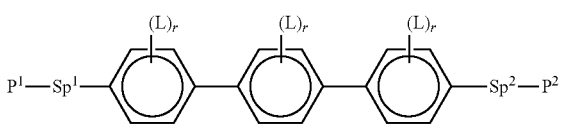
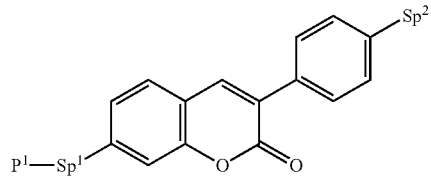

M17
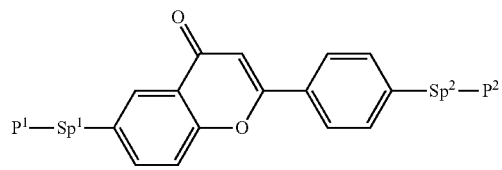
M18
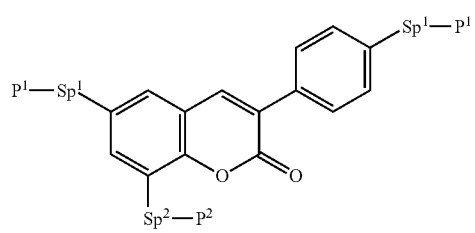
M19
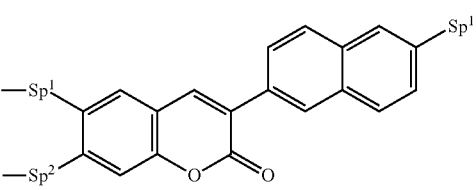
M20
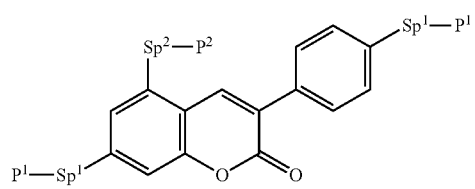
M21
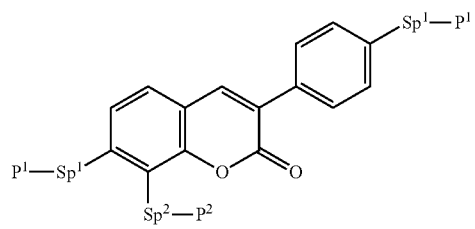
M22
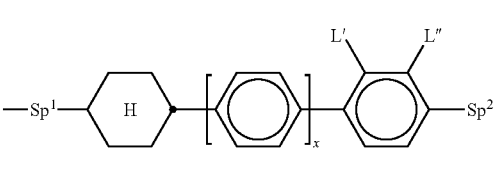
M23
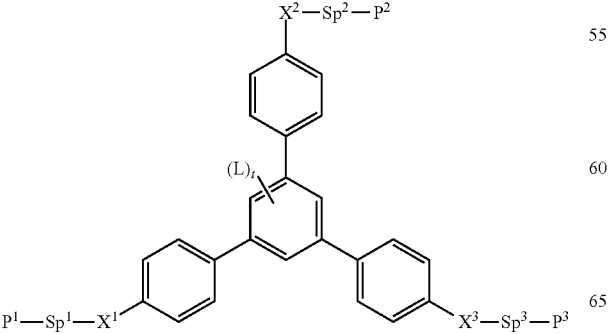
M24
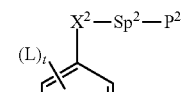
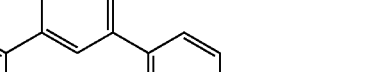
M25
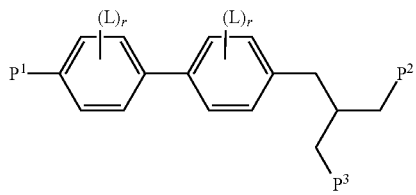
M26
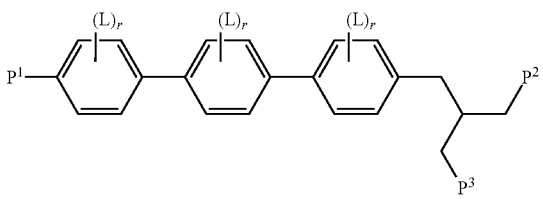
M27
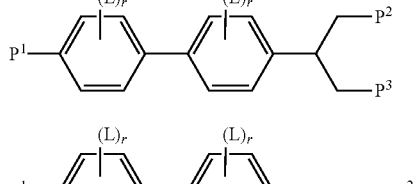
M28
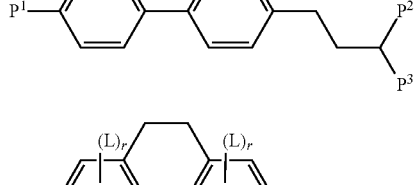
M29
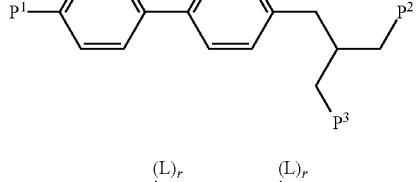
M30
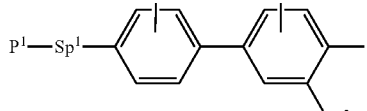
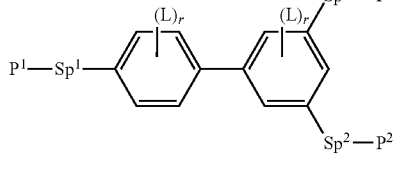
M31
M32
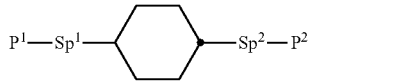

M33 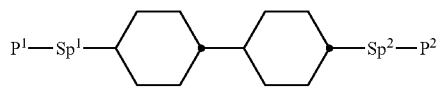

M34 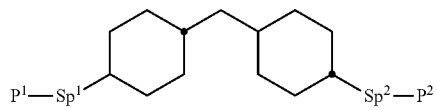

M35 

M36 

M37 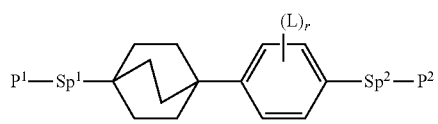

M38 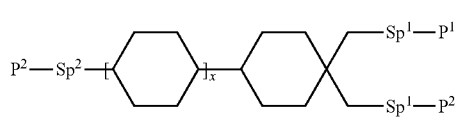

M39 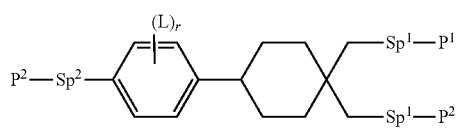

M40 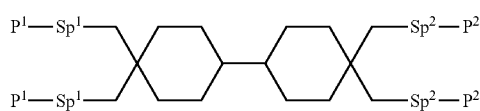

M41 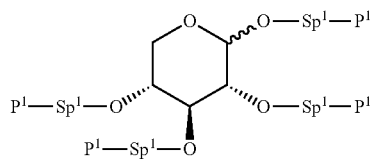

M42 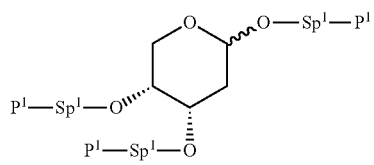

M43 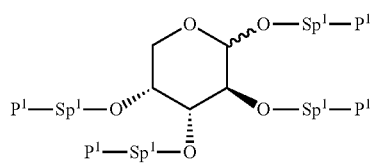

M44 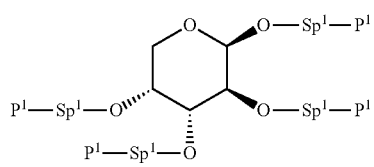

M45 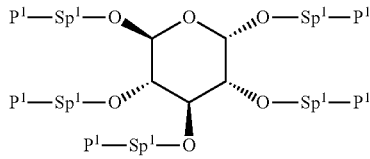

in which the individual radicals have the following meanings:

$P^1$, $P^2$ and $P^3$ each, independently of one another, denote a polymerisable group, preferably having one of the meanings indicated above and below for P, preferably an acrylate, methacrylate, fluoroacrylate, oxetane, vinyloxy or epoxide group, $Sp^1$, $Sp^2$ and $Sp^a$ each, independently of one another, denote a single bond or a spacer group, preferably having one of the meanings indicated above and below for M, and particularly preferably $-(CH_2)_{p1}-$, $-(CH_2)_{p1}-$, $-(CH_2)_{p1}-CO-O-$ or $-(CH_2)_{p1}-O-CO-O-$, in which p1 is an integer from 1 to 12, and where the bonding to the adjacent ring in the last-mentioned groups takes place via the O atom, where, in addition, one or more of the radicals $P^1$-$Sp^1$-, $P^2-Sp^2$- and $P^3-Sp^3$- may denote a radical $R^{aa}$, with the proviso that at least one of the radicals $P^1$-$Sp^1$-, $P^2-Sp^2$- and $P^3-Sp^3$- present does not denote $R^{aa}$, $R^{aa}$ denotes H, F, Cl, CN or straight-chain or branched alkyl having 1 to 25 C atoms, in which, in addition, one or more non-adjacent $CH_2$ groups may each be replaced, independently of one another, by $C(R^0)=C(R^{00})-$, $-C\equiv C-$, $-O-$, $-S-$, $-CO-$, $-CO-O-$, $-O-CO-$, $-O-CO-O-$ in such a way that O and/or S atoms are not linked directly to one another, and in which, in addition, one or more H atoms may be replaced by F, Cl, CN or $P^1$-$Sp^1$-, preferably straight-chain or branched, optionally mono- or polyfluorinated alkyl, alkoxy, alkenyl, alkynyl, alkylcarbonyl, alkoxycarbonyl or alkylcarbonyloxy having 1 to 12 C atoms (where the alkenyl and alkynyl radicals have at least two C atoms and the branched radicals have at least three C atoms), where $-OH$, $-NH_2$, $-SH$, $-NHR$, $-C(O)OH$ and $-CHO$ are not present in the group $R^{aa}$, $R^0$, $R^{00}$ each, independently of one another and on each occurrence identically or differently, denote H or alkyl having 1 to 12 C atoms, $R^Y$ and $R^Z$ each, independently of one another, denote H, F, $CH_3$ or $CF_3$, $X^1$, $X^2$ and $X^3$ each, independently of one another, denote $-CO-O-$, $O-CO-$ or a single bond, $Z^1$ denotes $-O-$, $-CO-$, $-C(R^YR^Z)-$ or $-CF_2CF_2-$, $Z^2$ and $Z^3$ each, independently of one another, denote $-CO-O-$, $-O-CO-$, $-CH_2O-$, $-OCH_2-$, $-CF_2O-$, $-OCF_2-$ or $-(CH_2)_n-$, where n is 2, 3 or 4, L on each occurrence, identically or differently, denotes F, Cl, CN, SCN, $SF_5$ or straight-chain or branched, optionally mono- or polyfluorinated alkyl, alkoxy, alkenyl, alkynyl, alkylcarbonyl, alkoxycarbonyl, alkylcarbonyloxy or alkoxycarbonyloxy having 1 to 12 C atoms, preferably F, L' and L" each, independently of one another, denote H, F or Cl, r denotes 0, 1, 2, 3 or 4, s denotes 0, 1, 2 or 3, t denotes 0, 1 or 2, x denotes 0 or 1.

In the compounds of the formulae M1 to M42, the ring group

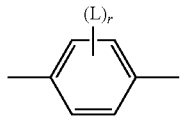

preferably denotes

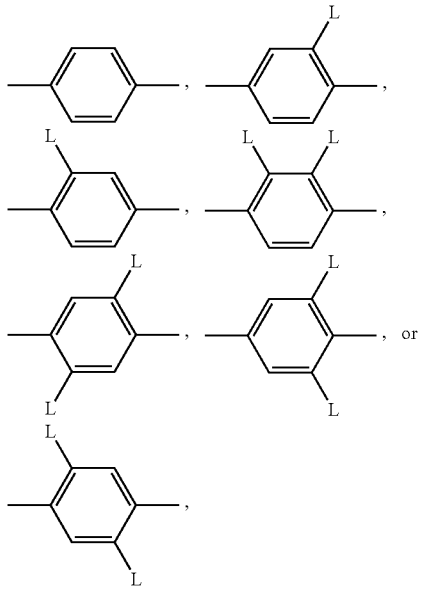

in which L, on each occurrence identically or differently, has one of the above meanings and preferably denotes F, Cl, CN, NO$_2$, CH$_3$, C$_2$H$_5$, C(CH$_3$)$_3$, CH(CH$_3$)$_2$, CH$_2$CH(CH$_3$)C$_2$H$_5$, OCH$_3$, OC$_2$H$_5$, COCH$_3$, COC$_2$H$_5$, COOCH$_3$, COOC$_2$H$_5$, CF$_3$, OCF$_3$, OCHF$_2$, OC$_2$F$_5$ or P-Sp-, particularly preferably F, Cl, CN, CH$_3$, C$_2$H$_5$, OCH$_3$, COCH$_3$, OCF$_3$ or P-Sp-, very particularly preferably F, Cl, CH$_3$, OCH$_3$, COCH$_3$ or OCF$_3$, in particular F or CH$_3$.

Preferred structures of reactive mesogen are of the formulae M1, M2, M3, M4 and M5.

In particular preferred are direactive compounds of formula M4 which are selected from the group of compounds of the following formulae, wherein P$^{11}$ and P$^{12}$ are both a methacrylic or acrylic group, more preferably both an acrylic group, and n and m are each and independently an integer from 1 to 12, preferably an integer from 3 to 6, and more preferably denote both 3, 4 or 6, most preferably both denote 3 or 6 in formula M4-1, and both denote 4 in formula M4-2.

Further preferred compounds are monoreactive compounds of formulae M1, M2, M4 and M5, which are selected from the group of compounds of the following formulae, M1-a
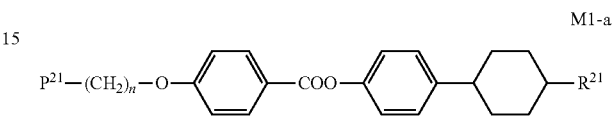

M2-a
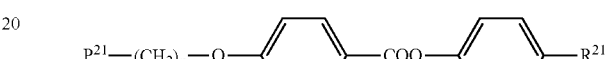

M4-a
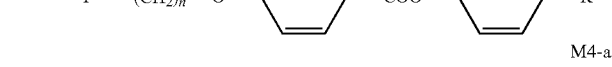

M4-b
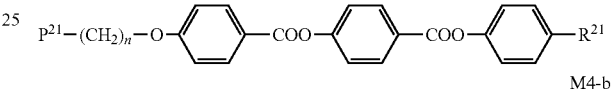

M4-c
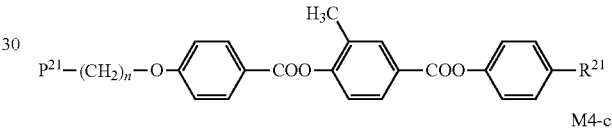

M4-d
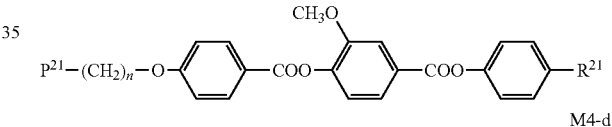

M4-e
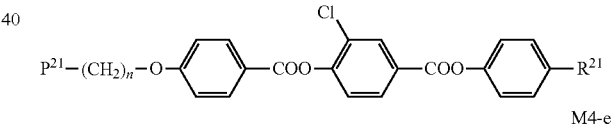

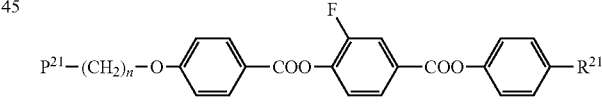

M4-1
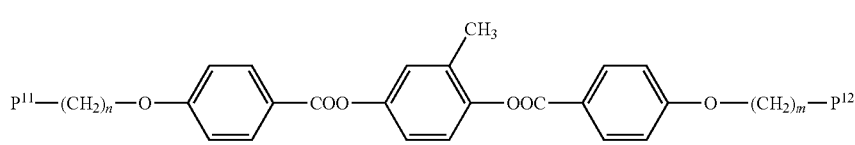

M4-2
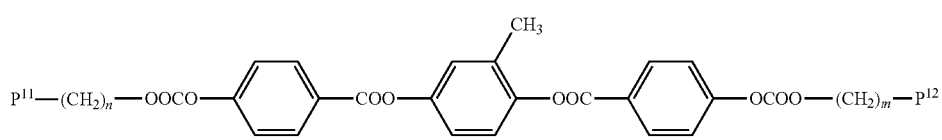

-continued

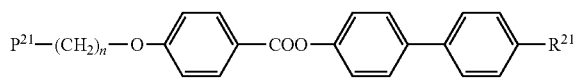

M5-a in which
P²¹ has one of the meanings as given above for P¹ under formula M, and preferably denotes a methacrylic or an acrylic group, more preferably an acrylic group,
R²¹ denotes F, Cl, CN, or straight or branched alkyl or alkoxy group having 1 to 5 C atoms, more preferably CN, CH₃, OCH₃ or C₃H₇, and
n denotes an integer from 1 to 12, preferably from 3 to 6 and more preferably 3 or 6.

In a preferred embodiment, the LC medium comprises a polymer component, which is preferably formed by one or more compounds of formula M or its subformulae. Preferably the polymer component preferably consists of a polymeric network which is obtained by polymerisation of the reactive mesogens and optionally other monomers or oligomers (prepolymers).

The polymerisable compounds of formula M or its subformulae can be polymerised individually, but it is also possible to polymerise mixtures which comprise two or more polymerisable compounds of formula M and its subformulae, or mixtures comprising one or more polymerisable compounds according to the invention and one or more further polymerisable compounds (co-monomers), which are preferably mesogenic or liquid-crystalline. In the case of polymerisation of such mixtures, copolymers are formed.

Preference is given LC mixture comprising two or more polymerisable compounds of formula M or its subformulae, or a mixture comprising three or more or more polymerisable compounds of formula M and its subformulae, which forms the polymerisable LC component of the LC medium.

The compounds of the formula M or its sub-formulae can be prepared analogously to processes known to the person skilled in the art and described in standard works of organic chemistry, such as, for example, in Houben-Weyl, Methoden der organischen Chemie [Methods of Organic Chemistry], Thieme-Verlag, Stuttgart.

Particularly preferred LC media according to the present invention described below and preferably comprises:
>5%, preferably >7%, more preferably >9%, but not more than 30%, preferably not more than 20% and most preferably not more than 15% of the polymerisable LC compounds, and/or
one, two or three polymerisable LC compounds of the formula M or sub-formulae thereof according to the invention, and/or
a polymerisable LC component which consists of polymerisable compounds of the formula M or sub-formulae thereof, and/or
a polymerisable LC component which consists of achiral polymerizable LC compounds, and/or
a polymerisable LC component which comprises one, two or more polymerisable compounds containing one polymerisable group (monoreactive), preferably selected from compounds of the formula M or preferred sub-formulae thereof, and/or
one, two or more polymerisable LC compounds containing two polymerisable groups (direactive), preferably selected from compounds of the formula M or preferred sub-formulae thereof, and/or
one, two or more polymerisable LC compounds containing three or more polymerisable groups (multireactive), preferably selected from compounds of the formula M or preferred sub-formulae thereof.

In a further preferred embodiment, the carbazole oxime ester photoinitiators in the LC medium in accordance to the present invention are selected from carbazole oxime ester photoinitiators as disclosed in US 2006/0241259 A1 or EP 1780209 A1.

Further preferred carbazole oxime ester photoinitiators are selected from the group of compounds of formula CO-1,

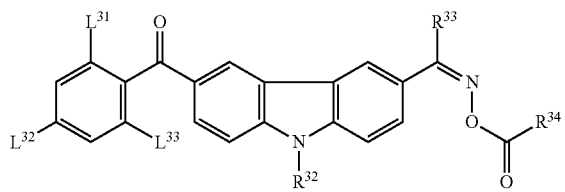

CO-1 wherein
$L^{31}$ to $L^{33}$ each and independently denotes H, alkyl, alkoxy, thioalkyl, alkylcarbonyl, alkoxycarbonyl, alkylcarbonyloxy or alkoxycarbonyloxy with 1 to 5 C atoms more; F, Cl, CN, NO₂, OCN, SCN, or mono- oligo- or polyfluorinated alkyl or alkoxy with 1 to 4 C atoms; or —($X^{31}$-$Sp^{31}$-$A^{31}$)
$X^{31}$ denotes —O—, —S— —CO—, —COO—, —OCO—, —O—COO—, —CO—NR$^{xx}$—, —NR$^{xx}$—CO—, —NR$^{xx}$—CO—NR$^{yy}$— or a single bond.
$R^{xx}$ and $R^{yy}$ each, independently of one another, denote H or alkyl having 1 to 12 C atoms, and
$Sp^{31}$ is a spacer group or a single bond,
$A^{31}$ denotes each and independently an aryl, heteroaryl, (non-aromatic) alicyclic and heterocyclic group, optionally having one or more substituents, which are preferably selected from the group comprising silyl, sulfo, sulfonyl, formyl, amine, imine, nitrile, mercapto, nitro, halogen, $C_{1-12}$ alkyl, $C_{6-12}$ aryl, $C_{1-12}$ alkoxy, hydroxyl, or combinations of these groups, and
$R^{32}$ to $R^{34}$ each, independently of one another, denote H or alkyl having 1 to 12 C atoms.

Further preferred carbazole oxime ester photoinitiators are selected from the group of compounds of the following formulae CO-2 to CO-9,

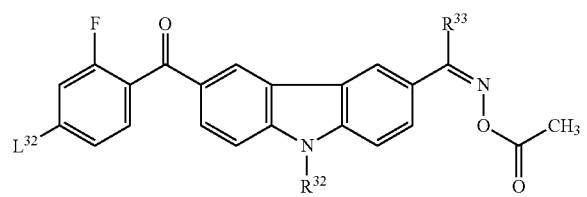

CO-2

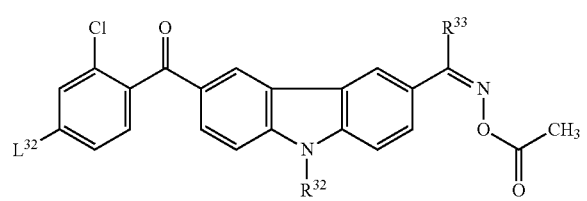

CO-3

-continued

CO-4
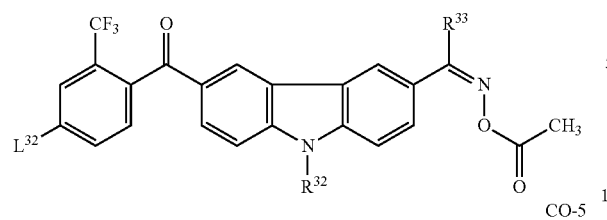

CO-5
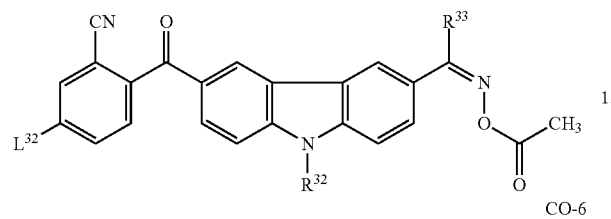

CO-6
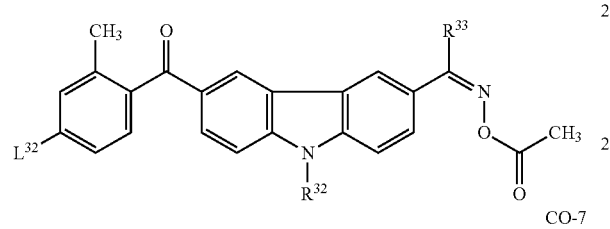

CO-7
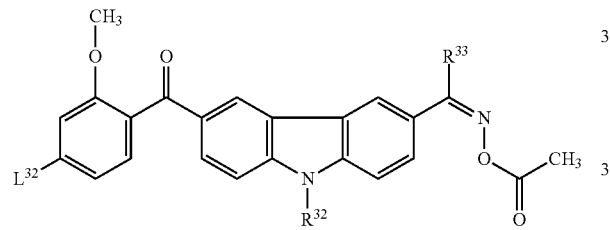

CO-8
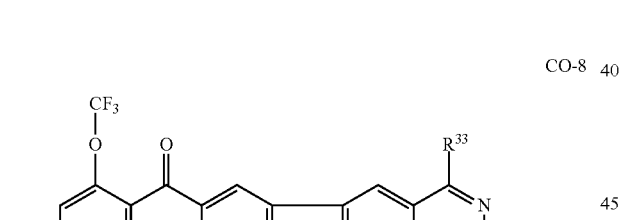

CO-9
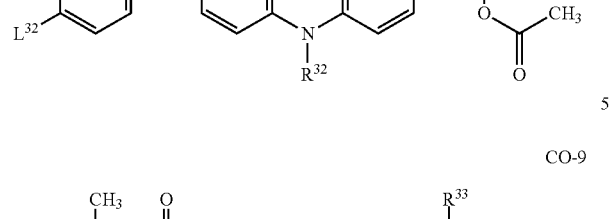

Wherein $L^{32}$, $R^{32}$ and $R^{33}$ have one of the meanings as given above under formula CO-1.

Further preferred are carbazole oxime ester photoinitiators, which are selected from the following formula CO-10 to CO-12, CO-10
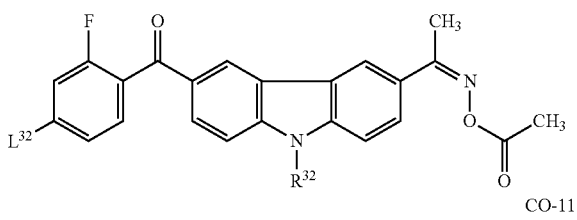

CO-11
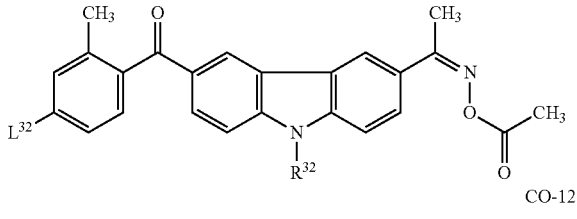

CO-12
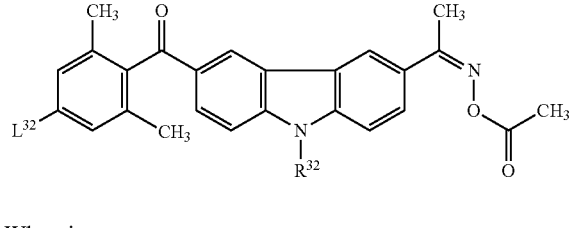

Wherein
$L^{32}$ and $R^{32}$ have one of the meanings as given above under formula CO-1

Especially preferred are carbazole oxime ester photoinitiators selected from the following formula CO-13 to CO-15, CO-13
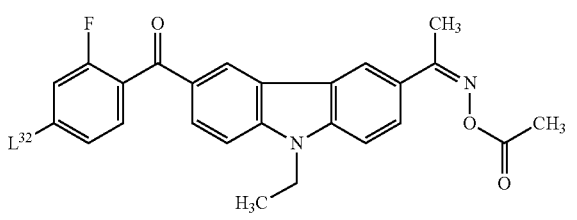

CO-14
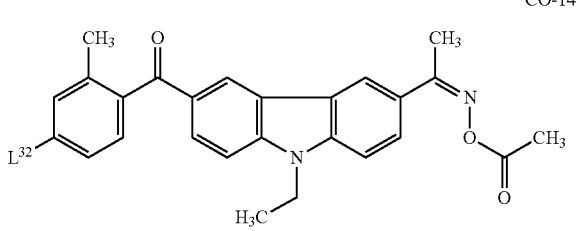

CO-15
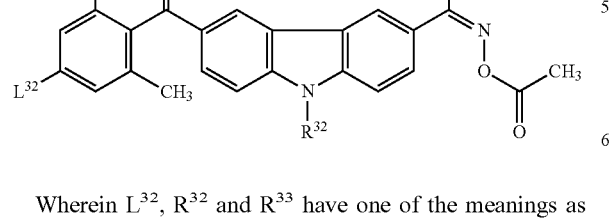

wherein $L^{32}$ has one of the meanings as given above under formula CO-1.

In particular preferred are carbazole oxime ester photoinitiators selected from the following formula CO-16 to CO-19,

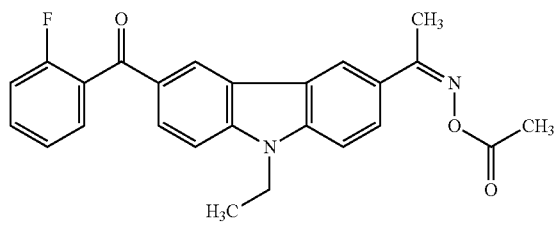
CO-16

-continued

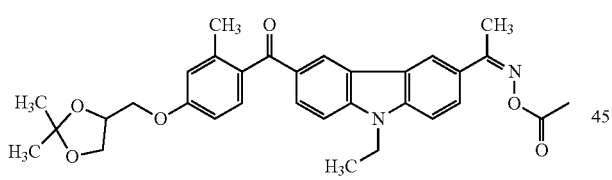
CO-17

CO-18

CO-19

Preferably the minimum amount of carbazole oxime ester photoinitiators in the polymerisable LC material as a whole is more than 0.5%, in particular more than 1%, most preferably more than 1.5% by weight.

Preferably, the maximum amount of carbazole oxime ester photoinitiators is preferably less than 10%, very preferably less than 7%, in particular less than 5% by weight of the whole polymerisable LC material.

The compounds of the formula CO or its sub-formulae can be prepared analogously to processes known to the person skilled in the art and described in standard works of organic chemistry, such as, for example, in Houben-Weyl, Methoden der organischen Chemie [Methods of Organic Chemistry], Thieme-Verlag, Stuttgart.

Preferably, the compounds of formula CO or its subformulae are prepared in analogy to the preparation as disclosed in US 2006/0241259 A1 or EP 1780209 A1.

The LC media according to the present preferably also comprises one or more dichroic dyes, which are preferably selected from the group of perylene dyes, anthrachinone dyes, and/or azo dyes that are known to the skilled person.

More preferably, the dichroic dyes are selected from the group of compounds of formula D,

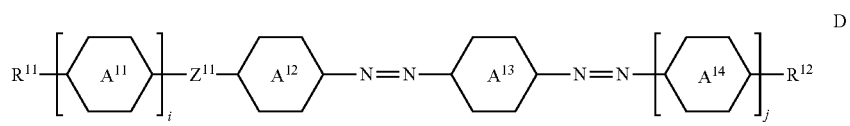
D wherein,

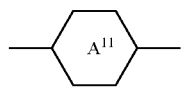

to

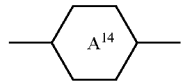

are at each occurrence, identically or differently, selected from

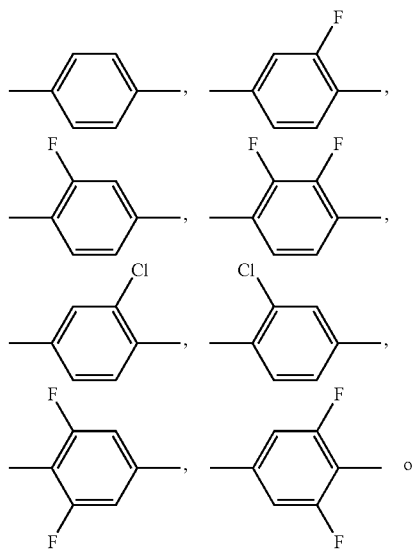

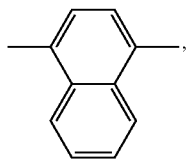

and, in case i is 2 or more, the terminal one of group

may also be

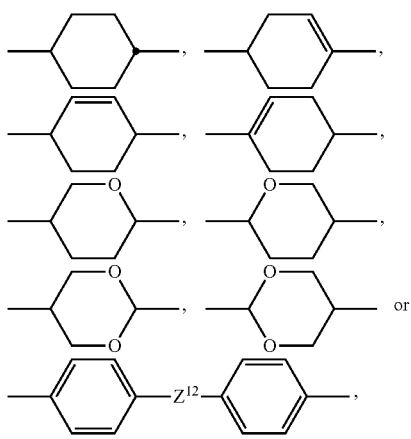

and, in case j is 2 or more, the terminal one of group,

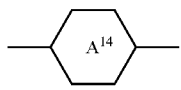

may also be

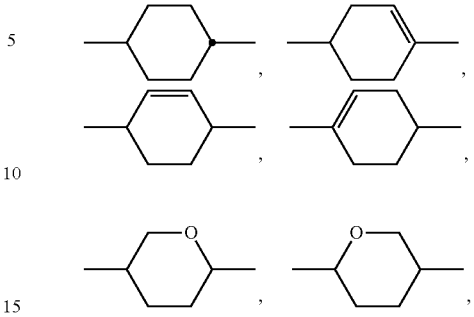

Z$^{11}$ and Z$^{12}$ are, independently of each other, —N=N—, —OCO— or —COO—,

R$^{11}$ and R$^{12}$ are, independently of each other, alkyl, alkoxy, fluorinated alkyl or fluorinated alkoxy, alkenyl, alkenyloxy, alkoxyalkyl or fluorinated alkenyl, alkylaminyl, dialkylaminyl, alkylcarbonyl, alkyloxycarbonyl, alkylcarbonyloxy, alkyloxycarbonyloxy or alkylcyclohexylalkyl, and i and j are independently of each other 1, 2, 3 or 4.

In a preferred embodiment of the present invention, the liquid crystalline medium comprises one or more dichroic dyes preferably selected from the group of compounds of formulae D-1 to D-7,

D-1

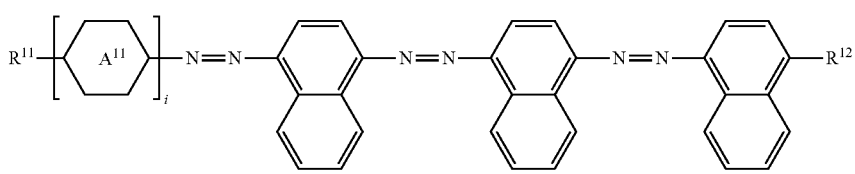

D-2

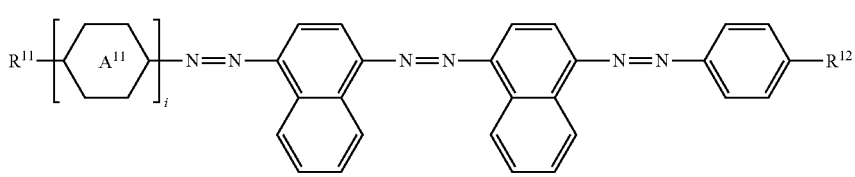

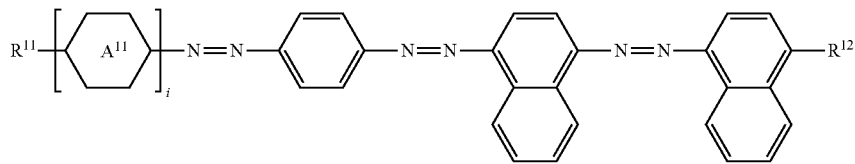
D-3
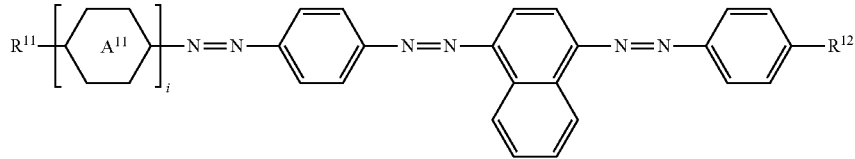
D-4
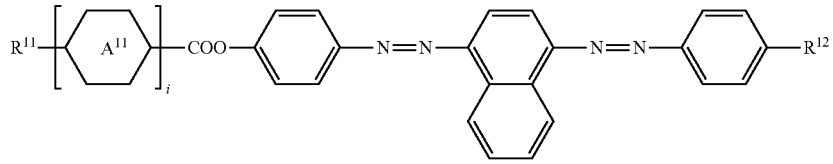
D-5
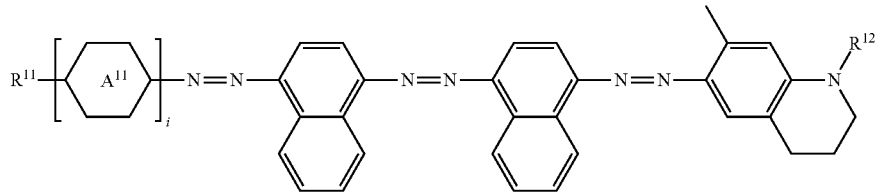
D-6
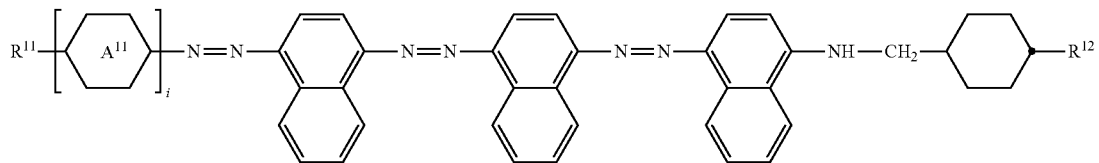
D-7
wherein the parameters have the respective meanings given under formula D above.
In a preferred embodiment of the present invention, the liquid crystalline medium comprises one or more dichroic dyes preferably selected from the group of compounds of formulae D'-1 to D'-7
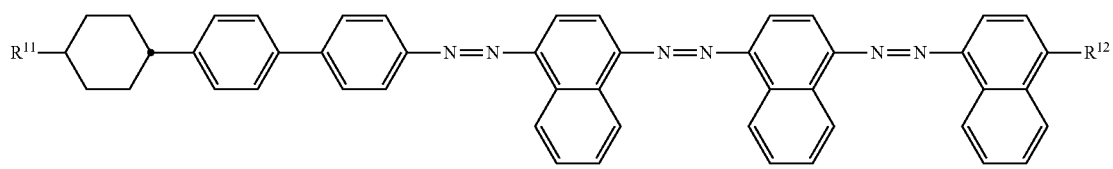
D'-1
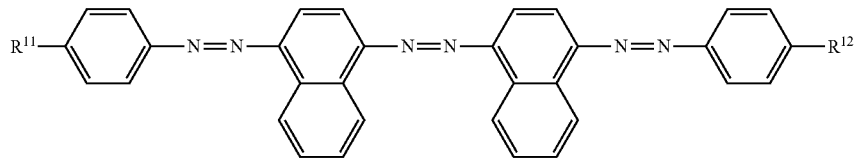
D'-2

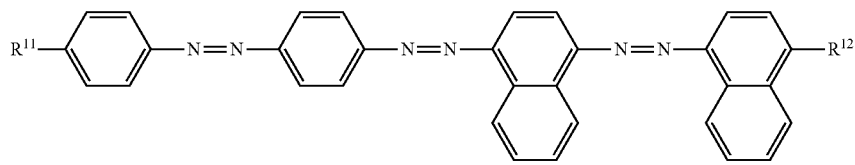
D'-3
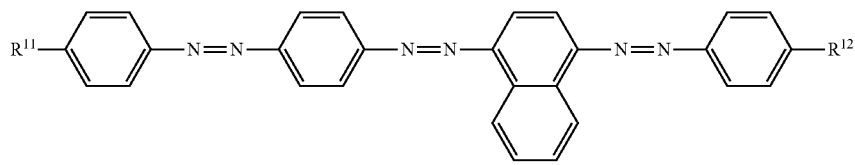
D'-4
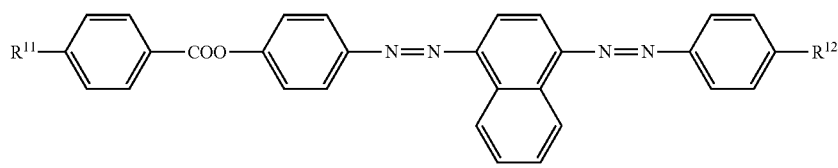
D'-5
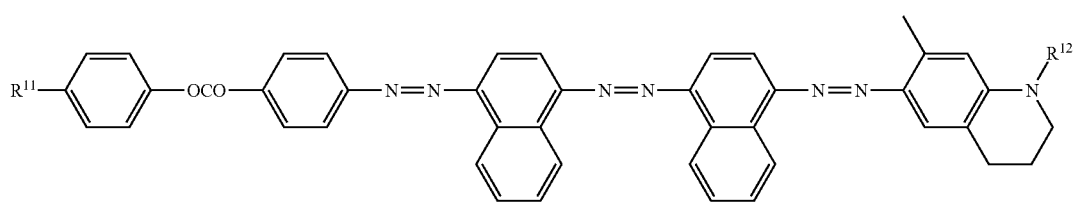
D'-6
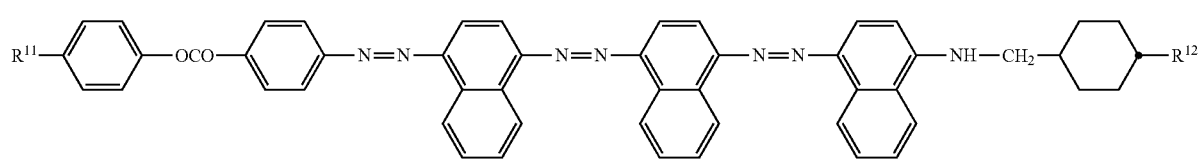
D'-7
wherein the parameters have the respective meanings given under formula D above.
Further preferred compounds of formula D are represented by the following formulae
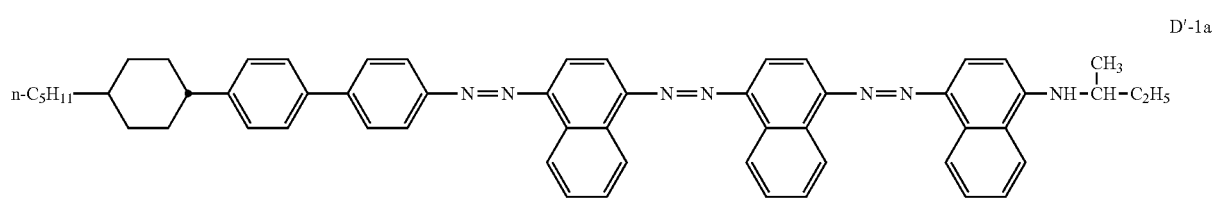
D'-1a
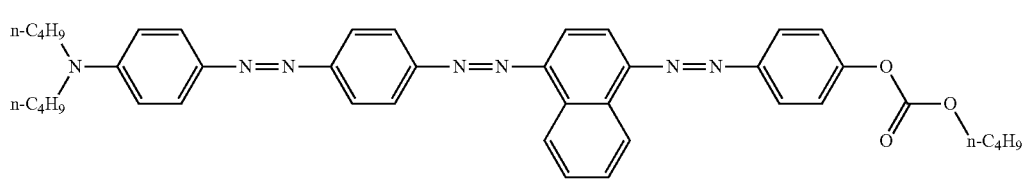
D'-4a
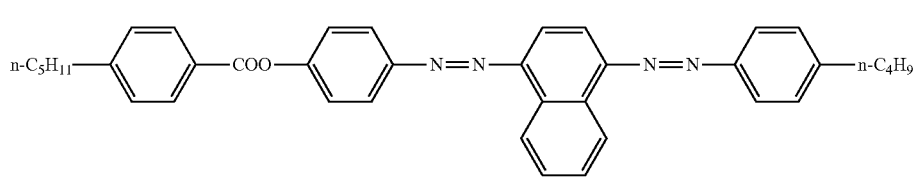
D'-5a

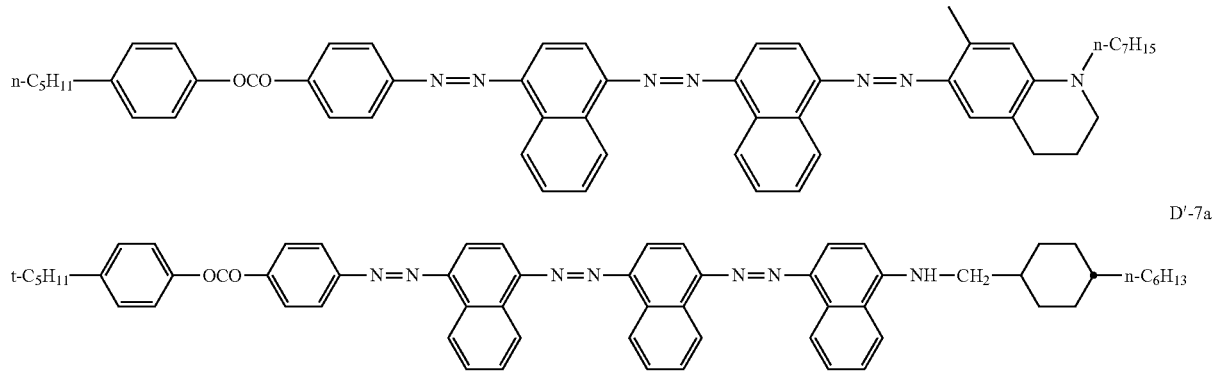

Preferably the concentration of the dichroic dyes in the medium is in the range from 0.1% to 5%, more preferably from 0.2% to 4%, even more preferably from 0.3% to 3%, most preferably from 0.5% to 2% and in particular about 1%.

The compounds of the formula D or its sub-formulae can be prepared analogously to processes known to the person skilled in the art and described in standard works of organic chemistry, such as, for example, in Houben-Weyl, Methoden der organischen Chemie [Methods of Organic Chemistry], Thieme-Verlag, Stuttgart.

In a preferred embodiment, the medium comprises a mixture of two or more, preferably of three or more dichroic dyes. Most preferably three dichroic dyes are at present. Preferably, the dichroic dyes have mutually complementing absorption spectra to each other, i. e. complementary absorption colours and are preferably mixed in a ratio relative to each other which results in a neutral colour of the combined absorption of the mixture, i. e. in a black appearance. This means that the absorption is almost constant over the visible spectral range.

For example, the spectral characteristic of a preferred combination of three compounds D'-1a, D'-4a and D'-5a are given in the following table:

| Dye | No. | D'-1a | D'-4a | D'-5a |
|---|---|---|---|---|
| | | F593 | F355 | F357 |
| | | ME-1107 | ME-301 | ME-540 |
| Absorption Spectrum in $CH_2Cl_2$ (1/100,000) | | | | |
| $\lambda_{max}$ | /nm | 621 | 536 | 426 |
| $\Delta\lambda_{max}$ | /nm | ±2 | ±2 | ±2 |
| OD* | | 0.620 | 0.785 | 0.520 |
| $\Delta$OD* | | ±0.020 | ±0.020 | ±0.020 |
| Colour | | Blue | Red | Yellow (Orange) |
| Dichroic Properties | | | | |
| Host LC§ | No. ZLI- | 2903 | 2452 | |
| DR** | | 16.2 | 13.7 | 13.0 |
| S*** | | 0.83 | 0.81 | 0.80 |

*Optical Density: OD = $\log_{10}$ ($l_i/l_t$),
$l_i$ = Intensity of incident light,
$l_t$ = Intensity of transmitted light,
§ZLI-mixtures available from Merck KGaA, Germany,
**Dichroic Ratio of Dye in Host LC and
***Order Parameter of Dye in Host LC.

Furthermore, it is possible to add to the LC media, for example, 0 to 15% by weight of pleochroic dyes, further- more nanoparticles, conductive salts, preferably ethyldim- ethyldodecylammonium 4-hexoxybenzoate, tetrabutyl-am- monium tetraphenylborate or complex salts of crown ethers (cf., for example, Haller et al., Mol. Cryst. Liq. Cryst. 24, 249-258 (1973)), for improving the conductivity, or sub- stances for modifying the dielectric anisotropy, the viscosity and/or the alignment of the nematic phases. Substances of this type are described, for example, in DE-A 22 09 127, 22 40 864, 23 21 632, 23 38 281, 24 50 088, 26 37 430 and 28 53 728.

The LC media according to the present invention prefer- ably also comprise one or more stabilisers in order to prevent undesired spontaneous polymerisation of the RMs, for example during storage or transport. Suitable types and amounts of stabilisers are known to the person skilled in the art and are described in the literature. Particularly suitable are, for example, the commercially available stabilisers from the Irganox® series (Ciba AG), such as, for example, Irganox® 1076. If stabilisers are employed, their proportion, based on the total amount of RMs or the polymerisable component, is preferably 10-10,000 ppm, particularly pref- erably 50-500 ppm.

The LC media according to the invention may also comprise further additives known to the person skilled in the art like for example further photoinitiators, further stabiliz- ers, inhibitors, chain-transfer agents, isotropic co-reacting monomers, surface-active compounds, lubricating agents, wetting agents, dispersing agents, hydrophobing agents, adhesive agents, flow improvers, defoaming agents, deaera- tors, diluents, reactive diluents, auxiliaries, colourants, fur- ther dyes, pigments or nanoparticles in usual concentrations.

Polymerisable additives are accordingly ascribed to the polymerisable component. Unpolymerisable additives are accordingly ascribed to the liquid-crystalline component.

In general, the total concentration of all compounds in the media according to this application is 100%.

It goes without saying to the person skilled in the art that the LC media according to the invention may also comprise compounds in which, for example, H, N, O, Cl, F have been replaced by the corresponding iso-topes.

The optimum mixing ratio of the compounds of the above-mentioned formulae depends substantially on the desired properties, on the choice of the components of the above-mentioned formulae and on the choice of any further components that may be present. Preferred physical prop- erties are given in the following.

In a preferred embodiment, the liquid-crystalline compo- nent according to the invention are characterised by optical anisotropy values as high as possible. The birefringence values are preferably in the range from 0.065 or more to 0.300 or less, more preferably in the range from 0.090 or more to 0.250 or less, especially in the range from 0.095 or more to 0.200 or less, in particular in the range from 0.100 or more to 0.175 or less.

Preferably, the liquid-crystalline component according to the invention are characterised by relatively high values of the modulus of the dielectric anisotropy (|Δε|), preferably as high as possible. In a preferred embodiment, values of the modulus of the dielectric anisotropy (|Δε|) are preferably in the range from 1.0 or more to 10 or less, preferably from 2 or more to 8 or less, particularly preferably from 3 or more to 7 or less and very particularly preferably from 4 or more to 6 or less.

Preferably, the liquid-crystalline component according to the invention are characterised by relatively high negative values of the of the dielectric anisotropy (−Δε).

The nematic phase of the liquid-crystalline component according to the invention preferably extends at least from 0° C. or below to 70° C. or above, more preferably at least from −20° C. or below to 75° C. or above, very preferably at least from −30° C. or below to 75° C. or above and in particular at least from −40° C. or below to 80° C. or above.

The clearing point of the liquid-crystalline component according to the invention before polymerisation is preferably in the range from 10° C. to 120° C., particularly preferably in the range from 20° C. to 110° C. and very particularly preferably in the range from 30° C. to 100° C.

Preferably, the liquid-crystalline component according to the present invention are characterised by relatively high values for the elastic constant K11 or K1, preferably as high as possible. In a preferred embodiment, the elastic constant K11 is approximately 10 pN or more, more preferably approximately 12 pN or more.

The liquid-crystalline component according to the present invention preferably have an elastic constant K33 or K3 of approximately 30 pN or less, more preferably of approximately 20 pN or less.

The rotational viscosity of the liquid-crystalline component is preferably as low as possible. Typically, the media according to the present invention, exhibit a rotational viscosity of approximately 400 mPas or less, preferably of approximately 300 mPas or less.

The LC media according to the present invention are prepared in a manner conventional per se, for example by mixing one or more of the above-mentioned compounds with one or more polymerisable compounds as defined above, and optionally with further liquid-crystalline compounds and/or additives. In general, the desired amount of the components used in lesser amount is dissolved in the components making up the principal constituent, advantageously at elevated temperature. It is also possible to mix solutions of the components in an organic solvent, for example in acetone, chloroform or methanol, and to remove the solvent again, for example by distillation, after thorough mixing. Accordingly, the invention also relates to the process for the preparation of the LC media according to the invention.

The LC media according to the present invention are very suitable for the use in different types of light modulation elements, especially in light shutters for T-OLED applications or in window applications. Therefore, the present invention also relates to the use of an LC medium as described and below in a light modulation element.

Typically such light modulation element comprises a LC cell having two opposing substrates and an electrode structure and a layer of the LC medium as described above and below located between the substrates of the LC cell. Therefore, the present invention also relates to the light modulation element comprising LC medium as described and below.

The invention furthermore relates to a process for the production of an light modulation element as described above and below in which an LC medium as described above and below is introduced into an LC cell having two substrates and an electrode arrangement, and the polymerisable compounds of the LC medium are polymerised, preferably with application of an electrical voltage to the electrodes.

Typically, the structure of the light modulation element according to the invention corresponds to the conventional structure for displays, which is known to the person skilled in the art.

As substrate, for example, glass or quartz sheets or plastic films can be used. When using two substrates in case of curing by actinic radiation, at least one substrate has to be transmissive for the actinic radiation used for the polymerisation.

Suitable and preferred plastic substrates are for example films of polyester such as polyethyleneterephthalate (PET) or polyethylene-naphthalate (PEN), polyvinylalcohol (PVA), polycarbonate (PC) or triacetylcellulose (TAC), very preferably PET or TAC films. As birefringent substrates for example uniaxially stretched plastics film can be used. PET films are commercially available for example from DuPont Teijin Films under the trade name Melinex®.

In a preferred embodiment, the substrates are arranged with a separation in the range from approximately 1 μm to approximately 50 μm from one another, preferably in the range from approximately 2 μm to approximately 20 μm from one another, and more preferably in the range from approximately 3 μm to approximately 10 μm from one another. The layer of the liquid-crystalline medium is thereby located in the interspace.

The substrate layers can be kept at a defined separation from one another, for example, by spacers, or projecting structures in the layer. Typical spacer materials are commonly known to the expert, as for example spacers made of plastic, silica, epoxy resins, etc.

In a further preferred embodiment of the invention, the layer of the liquid-crystalline medium is located between two flexible layers, for example flexible polymer films. The device according to the invention is consequently flexible and bendable and can be rolled up, for example.

The flexible layers can represent the substrate layer, the alignment layer, and/or polarisers. Further layers, which are preferable flexible, may also, be present. For a more detailed disclosure of the preferred embodiments, in which the layer of the liquid-crystalline medium is located between flexible layers, reference is given to the application US 2010/0045924.

Furthermore, an electrode arrangement and optionally further electrical components and connections are be present in the device according to the invention in order to facilitate electrical switching of the device, comparable to the switching of an LC display. Preferably, the utilized electrode structure is capable to induce an electric field, which is perpendicular with respect to the substrate's main plane.

Preferably, the light modulation element comprises an electrode arrangement, which is capable to allow the application of an electric field, which is substantially perpendicular to the substrate main plane or the cholesteric liquid-crystalline medium layer. Suitable electrode arrangements fulfilling this requirement are commonly known to the expert.

Preferably, the light modulation element comprises an electrode arrangement comprising at least two electrode structures provided on opposing sides of the substrates. Preferred electrodes structures are provided as an electrode layer on the entire opposing surface of each substrate and/or the pixel area.

Suitable electrode materials are commonly known to the expert, as for example electrode structures made of metal or metal oxides, such as, for example indium tin oxide (ITO), which is preferred according to the present invention.

Thin films of ITO, for example, are preferably deposited on substrates by physical vapour deposition, electron beam evaporation, or sputter deposition techniques.

Preferably, the electrodes of the light modulation element are associated with a switching element, such as a thin film transistor (TFT) or thin film diode (TFD).

In a preferred embodiment, the light modulation element comprises at least one dielectric layer, which is preferably on the electrode structure.

Typical dielectric layer materials are commonly known to the expert, such as, for example, SiOx, SiNx, Cytop, Teflon, and PMMA.

The dielectric layer materials can be applied onto the substrate or electrode layer by conventional coating techniques like spin coating, roll coating, blade coating, or vacuum deposition such as PVD or CVD. It can also be applied to the substrate or electrode layer by conventional printing techniques, which are known to the expert, like for example screen printing, offset printing, reel-to-reel printing, letterpress printing, gravure printing, rotogravure printing, flexographic printing, intaglio printing, pad printing, heat-seal printing, ink-jet printing or printing by means of a stamp or printing plate.

In a further preferred embodiment, the light modulation element comprises at least one alignment layer, which is preferably provided on the electrode layer.

The light modulation element may have further alignment layers, which are in direct contact with the layer of the liquid-crystalline medium.

Preferably, the alignment layer(s) induce(s) homeotropic alignment, preferably throughout the entire liquid-crystalline medium.

The alignment layers may also serve as substrate layers, so that substrate layers are not necessary in the light modulation element. If substrate layers are additionally present, the alignment layers are in each case arranged between the substrate layer and the layer of the liquid-crystalline medium. Typical alignment layer materials are commonly known to the expert. Suitable methods to achieve homeotropic alignment are described, for example, in J. Cognard, Mol. Cryst. Liq. Cryst. 78, Supplement 1, 1-77 (1981).

The alignment layer materials can be applied onto the substrate array or electrode structure by conventional coating techniques like spin coating, roll coating, dip coating or blade coating. It can also be applied by vapour deposition or conventional printing techniques, which are known to the expert, like for example screen printing, offset printing, reel-to-reel printing, letterpress printing, gravure printing, rotogravure printing, flexographic printing, intaglio printing, pad printing, heat-seal printing, ink-jet printing or printing by means of a stamp or printing plate.

It is likewise possible in accordance with the present invention and advantageous under certain conditions for the light modulation element to comprise no alignment layers adjacent to the layer of the liquid-crystalline medium.

As commonly known to the expert, by choosing a substrate with a corresponding surface energy, it is likewise possible to induce homeotropic alignment to the liquid-crystalline medium without utilizing a special alignment layer.

It is likewise possible that a homeotropically alignment can be achieved by adding to the liquid-crystalline medium one or more so called "self-alignment agents". Suitable self-alignment agents are, for example, described by Shie-Chang Jeng et al. Optics Letters (2009), 34, 455-457 or Shug-June Hwang et al. J. Phys D. Appl. Phys 2009, 42, 025102 or the self-alignment agents disclosed in US 2008/0198301, JP 2010-170090 A, EP 2 593 529 A1 or EP 2 606 101 A1.

In a further preferred embodiment of the invention, the light modulation element optionally comprises two or more polarisers, at least one of which is arranged on one side of the layer of the liquid-crystalline medium and at least one of which is arranged on the opposite side of the layer of the liquid-crystalline medium. The layer of the liquid-crystalline medium and the polarisers here are preferably arranged parallel to one another.

The polarisers can be linear polarisers. Preferably, precisely two polarisers are present in the light modulation element. In this case, it is furthermore preferred for the polarisers either both to be linear polarisers. If two linear polarisers are present in the light modulation element, it is preferred in accordance with the invention for the polarisation directions of the two polarisers to be crossed.

It is furthermore preferred in the case where two circular polarisers are present in the light modulation element for these to have the same polarisation direction, i.e. either both are right-hand circular-polarised or both are left-hand circular-polarised.

The polarisers can be reflective or absorptive polarisers. A reflective polariser in the sense of the present application reflects light having one polarisation direction or one type of circular-polarised light, while being transparent to light having the other polarisation direction or the other type of circular-polarised light. Correspondingly, an absorptive polariser absorbs light having one polarisation direction or one type of circular-polarised light, while being transparent to light having the other polarisation direction or the other type of circular-polarised light. The reflection or absorption is usually not quantitative; meaning that complete polarisation of the light passing through the polariser does not take place.

For the purposes of the present invention, both absorptive and reflective polarisers can be employed. Preference is given to the use of polarisers, which are in the form of thin optical films. Examples of reflective polarisers which can be used in the light modulation element according to the invention are DRPF (diffusive reflective polariser film, 3M), DBEF (dual brightness enhanced film, 3M), DBR (layered-polymer distributed Bragg reflectors, as described in U.S. Pat. Nos. 7,038,745 and 6,099,758) and APF (advanced polariser film, 3M).

Examples of absorptive polarisers, which can be employed in the light modulation elements according to the invention, are the Itos XP38 polariser film and the Nitto Denko GU-1220DUN polariser film. An example of a circular polariser, which can be used in accordance with the invention, is the APNCP37-035-STD polariser (American Polarizers). A further example is the CP42 polariser (ITOS). The device may furthermore comprise filters which block light of certain wavelengths, for example UV filters. In accordance with the invention, further functional layers, such as, for example, protective films, heat-insulation films or metal-oxide layers, may also be present.

The functional principle of the light modulation element according to the invention will be explained in detail below. It is noted that no restriction of the scope of the claimed invention, which is not present in the claims, is to be derived from the comments on the assumed way of functioning.

The light transmission of the light modulation element according to the invention is dependent on the applied electric field. In a preferred embodiment, the light transmission of the device is high in the initial state when no electric field is applied and preferably, gradually decreases when an electric field is applied.

In a preferred embodiment, the device according to the invention has a boundary state A and a boundary state B.

The light modulation element preferably has the boundary state A with a transmission $T_A$ when no electrical field is applied, the so called "off state" or transparent state.

The light modulation element preferably has another boundary state B when an electric field is applied, the so called "on state" or opaque state, in which the liquid crystal medium is increasingly distorted away from the vertical, whereby $T_A > T_B$.

In a preferred embodiment, a large proportion of the liquid-crystalline compounds are aligned vertically to the substrate surface (homeotropic alignment). With increasing electric field, the director of LC medium is changed.

The required applied electric field strength is mainly dependent on the electrode gap and the modulus of $\Delta\varepsilon$ of the LC mixture. The applied electric field strengths are typically lower than approximately 50 V/$\mu m^{-1}$, preferably lower than approximately 30 V/$\mu m^{-1}$ and more preferably lower than approximately 25 V/$\mu m^{-1}$. In particular, the applied electric field strengths is in the range from 4 V/$\mu m^{-1}$ to 20 V/$\mu m^{-1}$.

Preferably, the applied driving voltage in order to switch the light modulation element should be as low as possible. Typically, the applied driving voltage is in the range from 2 V to approximately 200 V, more preferably in the range from approximately 3 V to approximately 100 V, and even more preferably in the range from approximately 5 V to approximately 50 V.

A typical process of preparing the above described light modulation element according to the present invention comprises at least the steps of
  cutting and cleaning of the substrates,
  providing the electrode structure on each of the substrates,
  optionally providing an alignment layer on the electrode structure,
  assembling the cell using an adhesive (UV or heat curable) with spacer,
  filling the cell with the LC medium, and
  exposing the LC medium to actinic radiation that induces photopolymerisation of the polymerisable LC compounds in the LC medium.

Typically, the liquid crystal medium is filled into the cell. Conventional filling methods can be used which are known to the skilled person, like for example the so-called "one-drop filling" (ODF). Likewise also other commonly known methods can be utilized, such as, for example, vacuum injection method or inkjet printing method (IJP)

In the irradiation step, the light modulation element is exposed to actinic radiation that causes photopolymerisation of the polymerisable functional groups of the polymerisable compounds contained in the cholesteric liquid crystal medium. Polymerisation is achieved for example by exposing the polymerisable material to heat or actinic radiation. Actinic radiation means irradiation with light, like UV light, IR light or visible light, irradiation with X-rays or gamma rays or irradiation with high-energy particles, such as ions or electrons. Preferably, polymerisation is carried out by UV irradiation. As a source for actinic radiation, for example a single UV lamp or a set of UV lamps can be used. Another possible source for actinic radiation is a laser, like for example a UV, IR or visible laser.

Because of the irradiation the polymerisable compounds are substantially polymerised or crosslinked (in case of compounds with two or more polymerisable groups) in situ within the liquid crystal medium between the substrates forming the light modulation element.

The wavelength of the actinic radiation should not be too low, in order to avoid damage to the LC molecules of the medium, and should preferably be different from, very preferably higher than, the UV absorption maximum of the LC host mixture. On the other hand, the wavelength of the photo radiation should not be too high, to allow quick and complete UV photopolymerisation of the RMs, and should be not higher than, preferably the same as or lower than the UV absorption maximum of the polymerisable component.

Suitable wavelengths are preferably selected from 300 to 400 nm, for example 340 nm or more, preferably 350 nm or more, more preferably 360 nm or more.

The irradiation or exposure time should be selected such that polymerisation is as complete as possible, but still not be too high to allow a smooth production process. Also, the radiation intensity should be high enough to allow quick and complete polymerisation as possible, but should not be too high to avoid damage to the cholesteric liquid crystal medium.

The curing time depends, inter alia, on the reactivity of the polymerisable material, the thickness of the coated layer, the type of polymerisation initiator and the power of the UV lamp. The curing time is preferably 10 minutes, very preferably 5 minutes, most preferably 3 minutes. In general, for mass production shorter curing times are preferred, such as approximately 200 seconds to 10 seconds.

A suitable UV radiation power is preferably in the range from 5 to 250 mWcm$^{-2}$, more preferably in the range from 6 to 200 mWcm$^{-2}$, especially in the range from 7 to 200 mWcm$^{-2}$, and in particular 10 to 200 mWcm$^{-2}$.

In connection with the applied UV radiation and as a function of time, a suitable UV dose is preferably in the range from 500 to 7200 mJcm$^{-2}$ more preferably in the range from 1000 to 5000 mJcm$^{-2}$ and most preferably in the range from 1250 to 2500 mJcm$^{-2}$.

The light modulation element of the present invention can be used in various types of optical and electro-optical devices.

Said optical and electro optical devices include, without limitation electro-optical displays, liquid crystal displays (LCDs), non-linear optic (NLO) devices, optical information storage devices, light shutters and Smart Windows, preferably as light shutters for see through OLED displays.

It will be appreciated that many of the features described above, particularly of the preferred embodiments, are inventive in their own right and not just as part of an embodiment of the present invention. Independent protection may be sought for these features in addition to, or alternative to any invention presently claimed.

It will be appreciated that variations to the foregoing embodiments of the invention can be made while still falling within the scope of the invention. Alternative features serving the same, equivalent or similar purpose may replace each feature disclosed in this specification, unless stated otherwise. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Without further elaboration, it is believed that one skilled in the art can, using the preceding description, utilize the present invention to its fullest extent. The following examples are, therefore, to be construed as merely illustrative and not limitative of the remainder of the disclosure in any way whatsoever.

The parameter ranges indicated in this application all include the limit values including the maximum permissible errors as known by the expert.

The different upper and lower limit values indicated for various ranges of properties in combination with one another give rise to additional preferred ranges.

In the present application and especially in the following examples, the structures of the liquid crystal compounds are represented by abbreviations, which are also called "acronyms". The transformation of the abbreviations into the corresponding structures is straightforward according to the following three tables A to C. Table A lists the symbols used for the ring elements, table B those for the linking groups and table C those for the symbols for the left hand and the right hand end groups of the molecules.

All groups $C_nH_{2n+1}$, $C_mH_{2m+1}$, and $C_lH2_{l+1}$ are preferably straight chain alkyl groups with n, m and l C-atoms, respectively, all groups $C_nH_{2n}$, $C_mH_{2m}$ and $C_lH_{2l}$ are preferably $(CH_2)_n$, $(CH_2)_m$ and $(CH_2)_l$, respectively and —CH=CH— preferably is trans- respectively E vinylene.

TABLE A

| | Ring Elements | | |
|---|---|---|---|
| C |  | P | 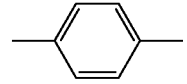 |
| D | 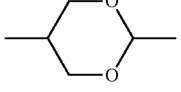 | DI | 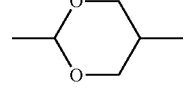 |
| A |  | AI | 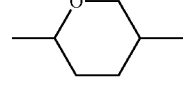 |
| G | 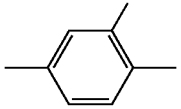 | GI | 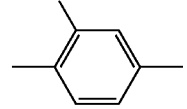 |
| U | 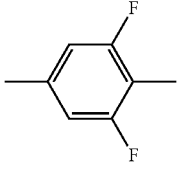 | UI | 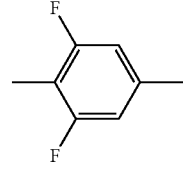 |
| Y | 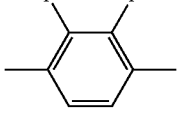 | | |
| M | 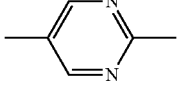 | MI | 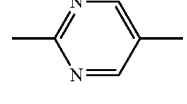 |
| N | 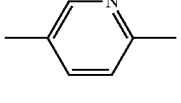 | NI | 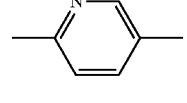 |

TABLE A-continued

Ring Elements

| Code | Structure |
|------|-----------|
| np | 2,6-naphthalene |
| n3f | 1,2,8-trifluoronaphthalene-3,6-diyl |
| n3fI | 1,2,8-trifluoronaphthalene-3,6-diyl (inverted) |
| th | tetrahydronaphthalene-2,6-diyl |
| thI | tetrahydronaphthalene-2,6-diyl (inverted) |
| th2f | 1,2-difluoro-tetrahydronaphthalene-3,6-diyl |
| th2fI | 1,2-difluoro-tetrahydronaphthalene-3,6-diyl (inverted) |
| o2f | 7,8-difluorochroman-2,6-diyl |
| o2fI | 7,8-difluorochroman-2,6-diyl (inverted) |
| dh | decahydronaphthalene-2,6-diyl |
| K | fluorinated indane |
| KI | fluorinated indane (inverted) |
| L | cyclohexene-1,4-diyl |
| LI | cyclohexene-1,4-diyl (inverted) |
| F | fluorocyclohexene |
| FI | fluorocyclohexene (inverted) |

TABLE B

Linking Groups

| | |
|---|---|
| E | —CH$_2$—CH$_2$— |
| V | —CH=CH— |
| T | —C≡C— |
| W | —CF$_2$—CF$_2$— |
| B | —CF=CF— |
| Z | —CO—O— |
| ZI | —O—CO— |

TABLE B-continued

Linking Groups

| | | | |
|---|---|---|---|
| X | —CF=CH— | XI | —CH=CF— |
| O | —CH$_2$—O— | OI | —O—CH$_2$— |
| Q | —CF$_2$—O— | QI | —O—CF$_2$— |

TABLE C

End Groups

| Left hand side, used alone or in combination with others | | Right hand side, used alone or in combination with others | |
|---|---|---|---|
| -n- | $C_nH_{2n+1}-$ | -n | $-C_nH_{2n+1}$ |
| -nO- | $C_nH_{2n+1}-O-$ | -nO | $-O-C_nH_{2n+1}$ |
| -V- | $CH_2=CH-$ | -V | $-CH=CH_2$ |
| -nV- | $C_nH_{2n+1}-CH=CH-$ | -nV | $-C_nH_{2n}-CH=CH_2$ |
| -Vn- | $CH_2=CH-C_nH_{2n}-$ | -Vn | $-CH=CH-C_nH_{2n+1}$ |
| -nVm- | $C_nH_{2n+1}-CH=CH-C_mH_{2m}-$ | -nVm | $-C_nH_{2n}-CH=CH-C_mH_{2m+1}$ |
| -N- | $N\equiv C-$ | -N | $-C\equiv N$ |
| -S- | $S=C=N-$ | -S | $-N=C=S$ |
| -F- | F- | -F | -F |
| -CL- | Cl- | -CL | -Cl |
| -M- | $CFH_2-$ | -M | $-CFH_2$ |
| -D- | $CF_2H-$ | -D | $-CF_2H$ |
| -T- | $CF_3-$ | -T | $-CF_3$ |
| -MO- | $CFH_2O-$ | -OM | $-OCFH_2$ |
| -DO- | $CF_2HO-$ | -OD | $-OCF_2H$ |
| -TO- | $CF_3O-$ | -OT | $-OCF_3$ |
| -A- | $H-C\equiv C-$ | -A | $-C\equiv C-H$ |
| -nA- | $C_nH_{2n+1}-C\equiv C-$ | -An | $-C\equiv C-C_nH_{2n+1}$ |
| -NA- | $N\equiv C-C\equiv C-$ | -AN | $-C\equiv C-C\equiv N$ |

| Left hand side, used in combination with others only | | Right hand side, used in combination with others only | |
|---|---|---|---|
| -...n...- | $-C_nH_{2n}-$ | -...n... | $-C_nH_{2n}-$ |
| -...M...- | $-CFH-$ | -...M... | $-CFH-$ |
| -...D...- | $-CF_2-$ | -...D... | $-CF_2-$ |
| -...V...- | $-CH=CH-$ | -...V... | $-CH=CH-$ |
| -...Z...- | $-CO-O-$ | -...Z... | $-CO-O-$ |
| -...ZI...- | $-O-CO-$ | -...ZI... | $-O-CO-$ |
| -...K...- | $-CO-$ | -...K... | $-CO-$ |
| -...W...- | $-CF=CF-$ | -...W... | $-CF=CF-$ | wherein n and m each are integers and three points " ... " indicate a space for other symbols of this table.

EXAMPLES

LC Component

The following mixture M-1 is prepared.

| CY-3-O4 | 11.00% | T(N, I) [° C.]: | 110.5 |
|---|---|---|---|
| CY-5-O2 | 10.00% | Δn [589 nm, 20° C.] | 0.159 |
| CCY-3-O2 | 10.00% | Δε [kHz, 20° C.]: | −5.0 |
| CCY-3-O3 | 10.00% | $\gamma_1$ [mPa · s, 20° C.]: | 371 |
| CPY-2-O2 | 11.00% | $K_1$ [20° C.]: | 18.2 |
| CPY-3-O2 | 12.00% | $K_3$ [20° C.]: | 19.2 |
| PYP-2-3 | 14.00% | $V_0$ [V]: | 2.07 |
| PYP-2-4 | 10.00% | | |
| CCP-V-1 | 8.00% | | |
| CPP-3-2 | 2.00% | | |
| PGP-2-3 | 2.00% | | |

Polymerisable LC Compounds:

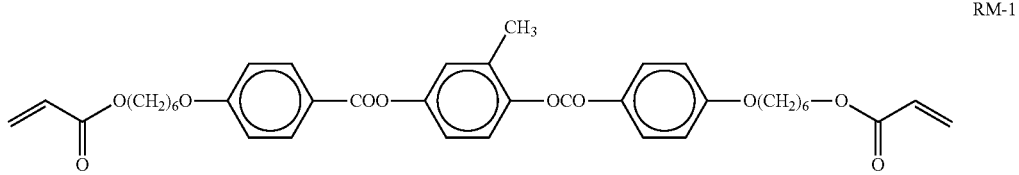

RM-1

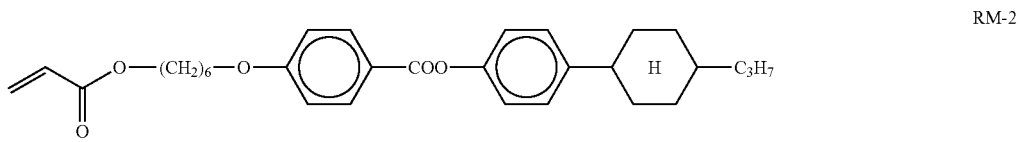

RM-2

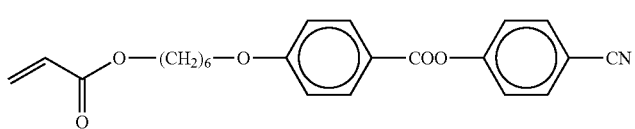

RM-3

Dichroic Dyes:

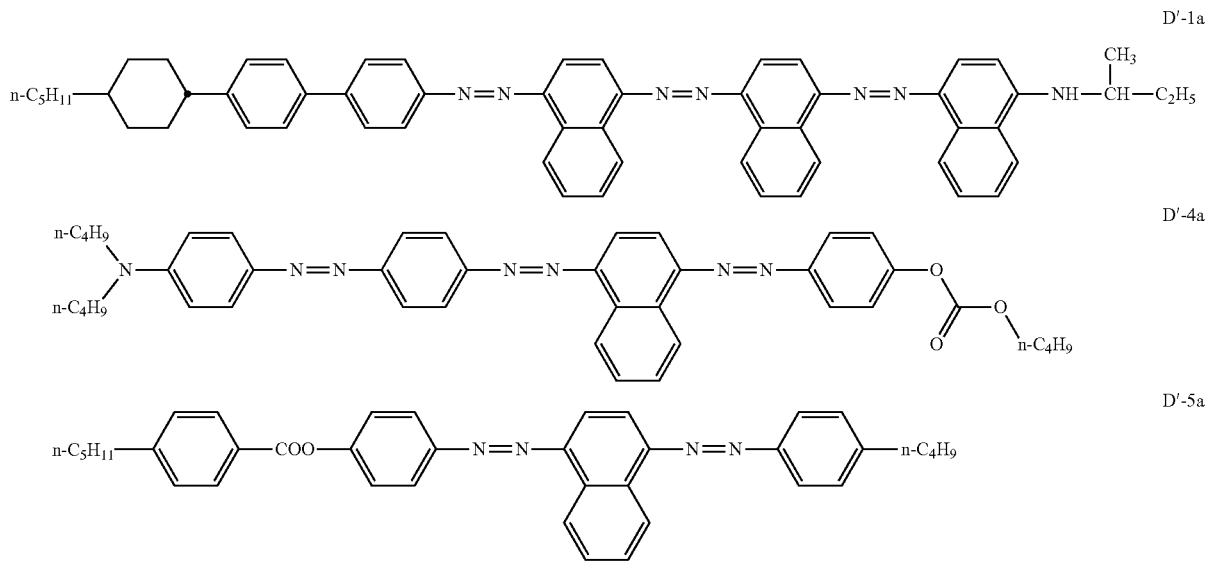

Photoinitiators:

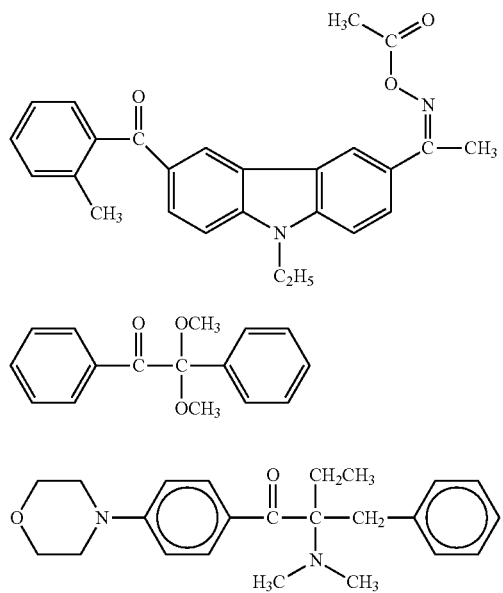

Test Cell

On an ITO coated glass substrates, a 50 nm VA-polyimide (AL60702, JSR) layer is spin coated. After drying, the test cell is assembled, while two of the above described substrates are oriented parallel to each other with a cell gap of 10 μm. The test cell is filled with the corresponding mixture as described in the following examples. The polymerisable component is then cured with in the test cell with the corresponding curing parameters as given in the following examples. A corresponding electric field as given in the following examples is applied to the test cell in order to switch from the "off state" to the opaque "on state".

Methods

Four different transmission measurements (T1 to T4) are performed, which are commonly known by the skilled person:

T1 (depicted in FIG. 1): Transmission without sample and white reflection standard T2 (depicted in FIG. 2): Transmission with sample and white reflection standard T3 (depicted in FIG. 3): Transmission without sample with open measurement port T4 (depicted in FIG. 4): Transmission with sample and with open measurement port As commonly known by the skilled person, the total transmittance (T2) is thereby defined as the sum of the parallel transmittance and the diffusion transmittance (T4).

The Haze is thereby defined as follows: Haze=[(T4/T2)−(T3/T1)]×100%

Example 1

89.4% of mixture M1, 5% of RM-1, 3% of RM-2, 2% of RM-3, 0.3% of a dichroic dye mixture (53% of D'-1a, 19% of D'-4a, and 28% of D'-5a), and 0.3% of PI-1 (Oxe 02 from CIBA) are mixed and filled in the test cell as given above.

The cell is then exposed to UV light with Mirho UV CURE 850 (Mercuri UV lamp) with 365 band pass filter and with 200 mW for 10 s.

After curing, the test cell appears clear without any discoloration effects.

Example 2

89.2% of mixture M1, 5% of RM-1, 3% of RM-2, 2% of RM-3, 0.5% of a dichroic dye mixture (53% of D'-1a, 19% of D'-4a, and 28% of D'-5a), and 0.3% of PI-1 (Oxe 02 from CIBA) are mixed and filled in the test cell as given above. The cell is then exposed to UV light with Mirho UV CURE 850 (Mercuri UV lamp) with 365 band pass filter and with 200 mW for 10 s.

After curing, the test cell appears clear without any discoloration effects.

Comparative Example 1

89.4% of mixture M1, 5% of RM-1, 3% of RM-2, 2% of RM-3, 0.3% of a dichroic dye mixture (53% of D'-1a, 19% of D'-4a, and 28% of D'-5a), and 0.3% of PI-2 (Irgacure 651 from CIBA) are mixed and filled in the test cell as given above. The cell is then exposed to UV light with Mirho UV CURE 850 (Mercuri UV lamp) with 365 band pass filter and with 200 mW for 10 s.

After curing, the test cell appears slightly yellow showing clearly the discoloration effects resulting from the curing process.

Comparative Example 2

89.2% of mixture M1, 5% of RM-1, 3% of RM-2, 2% of RM-3, 0.5% of a dichroic dye mixture (53% of D'-1a, 19% of D'-4a, and 28% of D'-5a), and 0.3% of PI-2 (Irgacure 651 from CIBA) are mixed and filled in the test cell as given above. The cell is then exposed to UV light with Mirho UV CURE 850 (Mercuri UV lamp) with 365 band pass filter and with 200 mW for 10 s.

After curing, the test cell appears slightly yellow showing clearly the discoloration effects resulting from the curing process.

Comparative Example 3

89.4% of mixture M1, 5% of RM-1, 3% of RM-2, 2% of RM-3, 0.3% of a dichroic dye mixture (53% of D'-1a, 19% of D'-4a, and 28% of D'-5a), and 0.3% of PI-3 (Irgacure 369 from CIBA) are mixed and filled in the test cell as given above. The cell is then exposed to UV light with Mirho UV CURE 850 (Mercuri UV lamp) with 365 band pass filter and with 200 mW for 10 s.

After curing, the test cell appears slightly red, showing clearly the discoloration effects resulting from the curing process.

Summary

Among all tested photo-initiators, there are no significant differences in the haze level (cf. FIG. 5), as well as in the parallel transmittance values of each sample (cf. FIG. 6). However, there are significant differences in the total transmittance (cf. FIG. 7) of each sample. In conclusion, discoloration as shown in comparative example 1 and 3 causes significant lower values for the diffusion transmittance. In contrast to that, example 1 shows higher values for the diffusion transmittance, and a better performance in the background shielding can be achieved.

Figure 1:
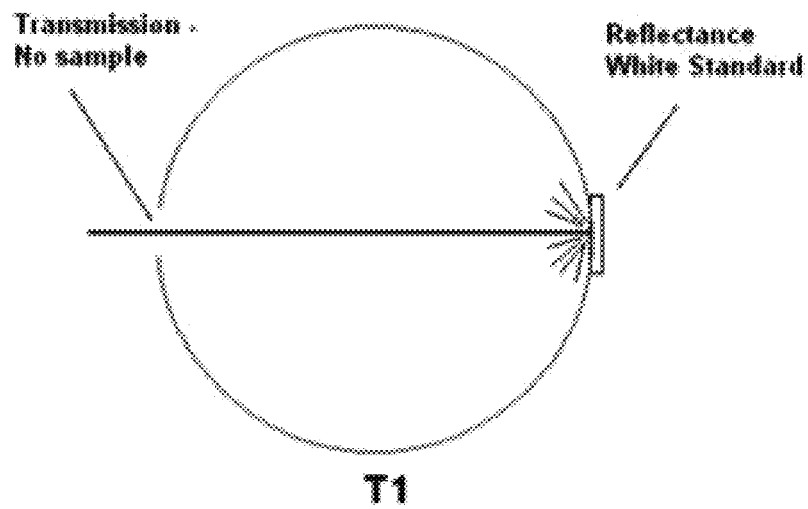
FIGS. 1-4 depict transmission measurements.
Figure 2:
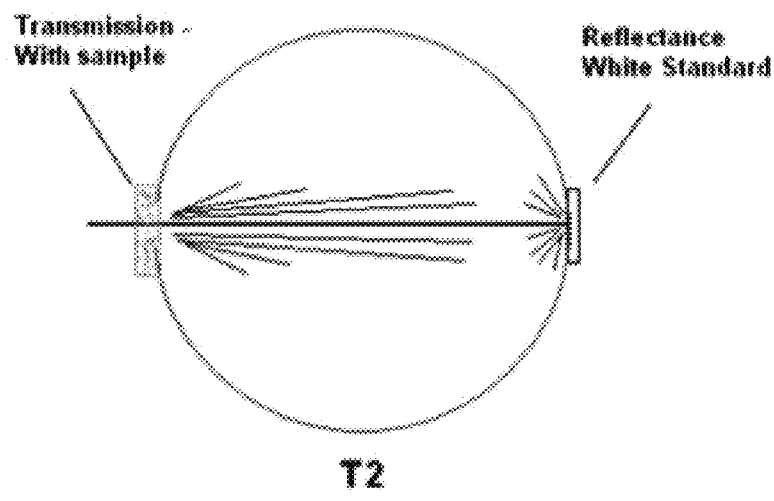
Figure 3:
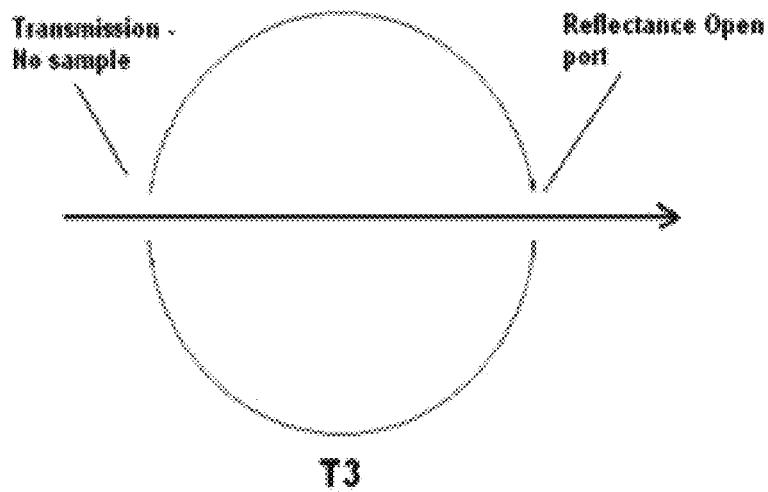
Figure 4:
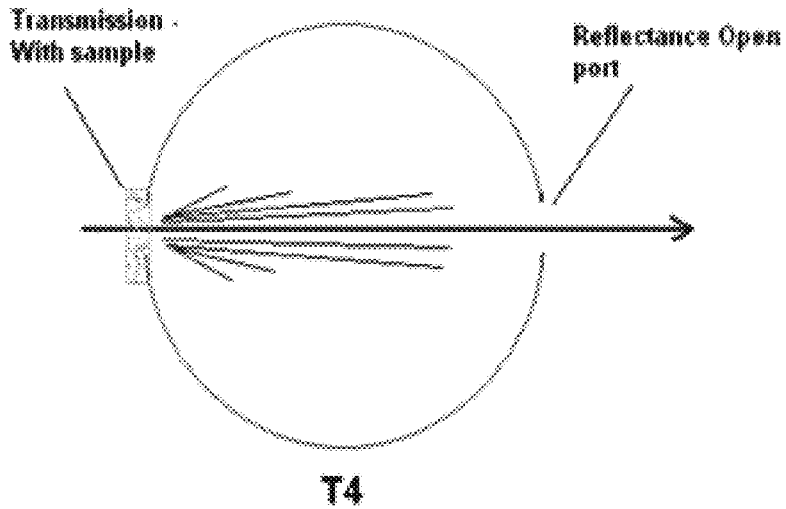
Figure 5:
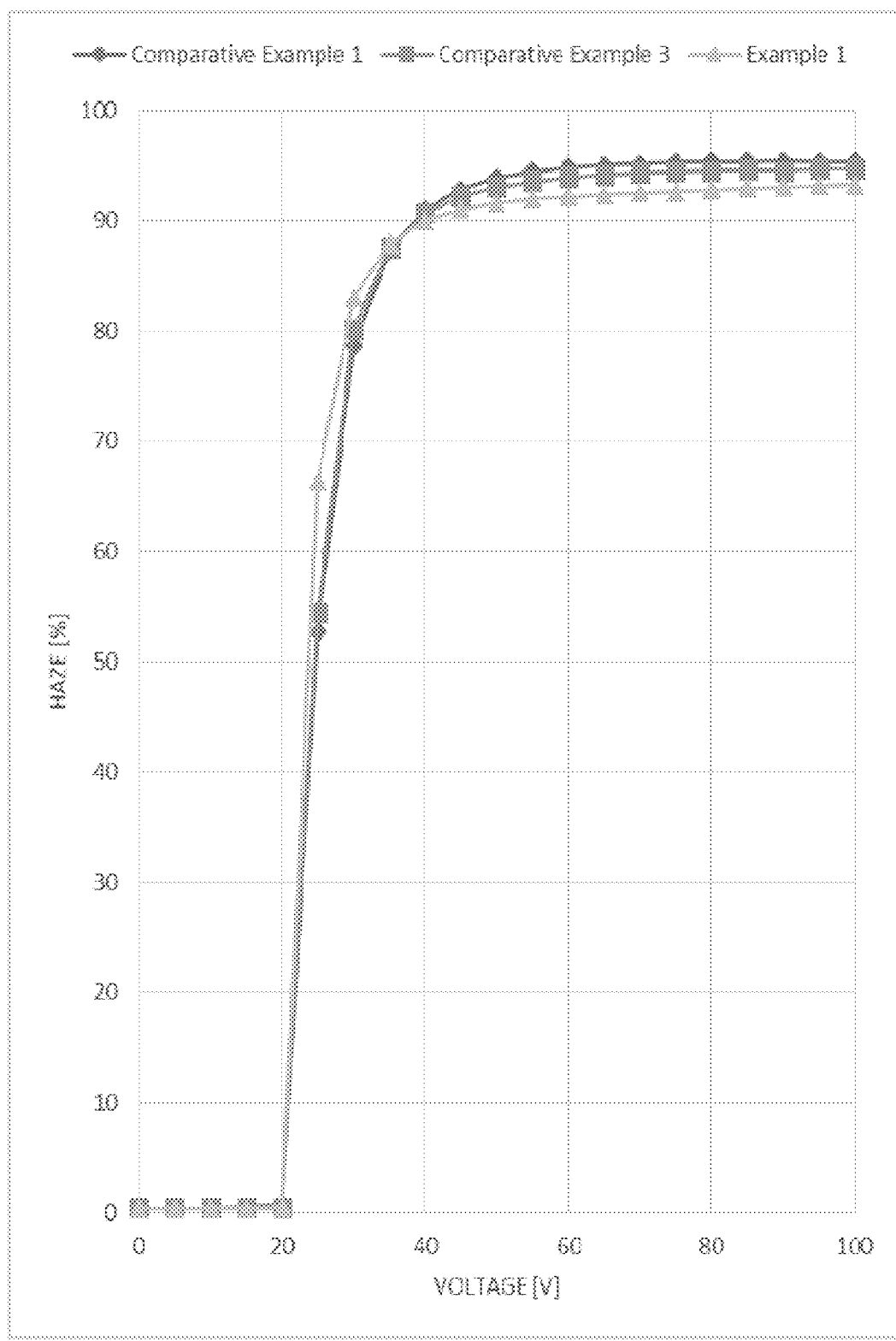
FIGS. 5-7 are graphs.
Figure 6:
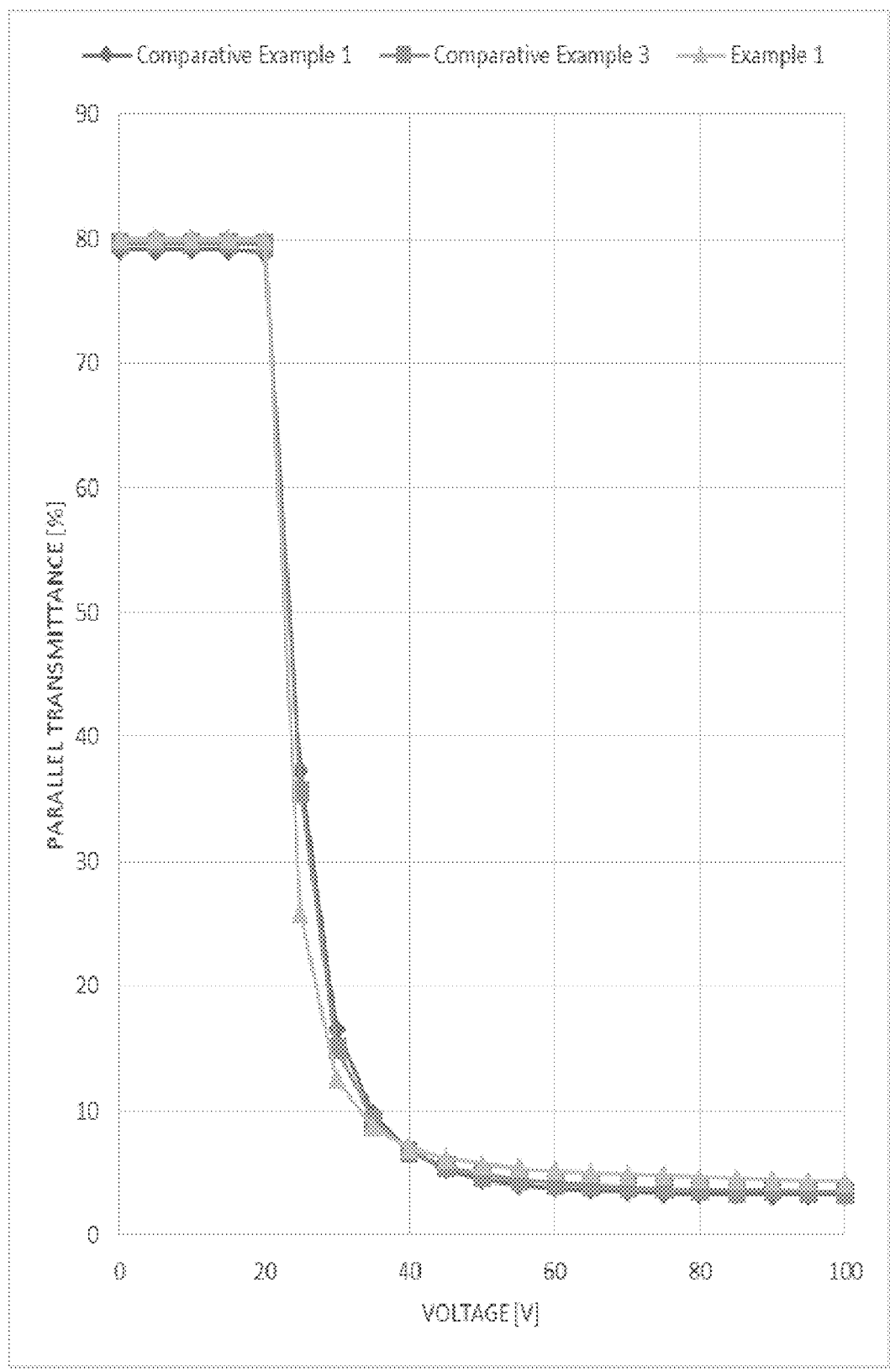
Figure 7:
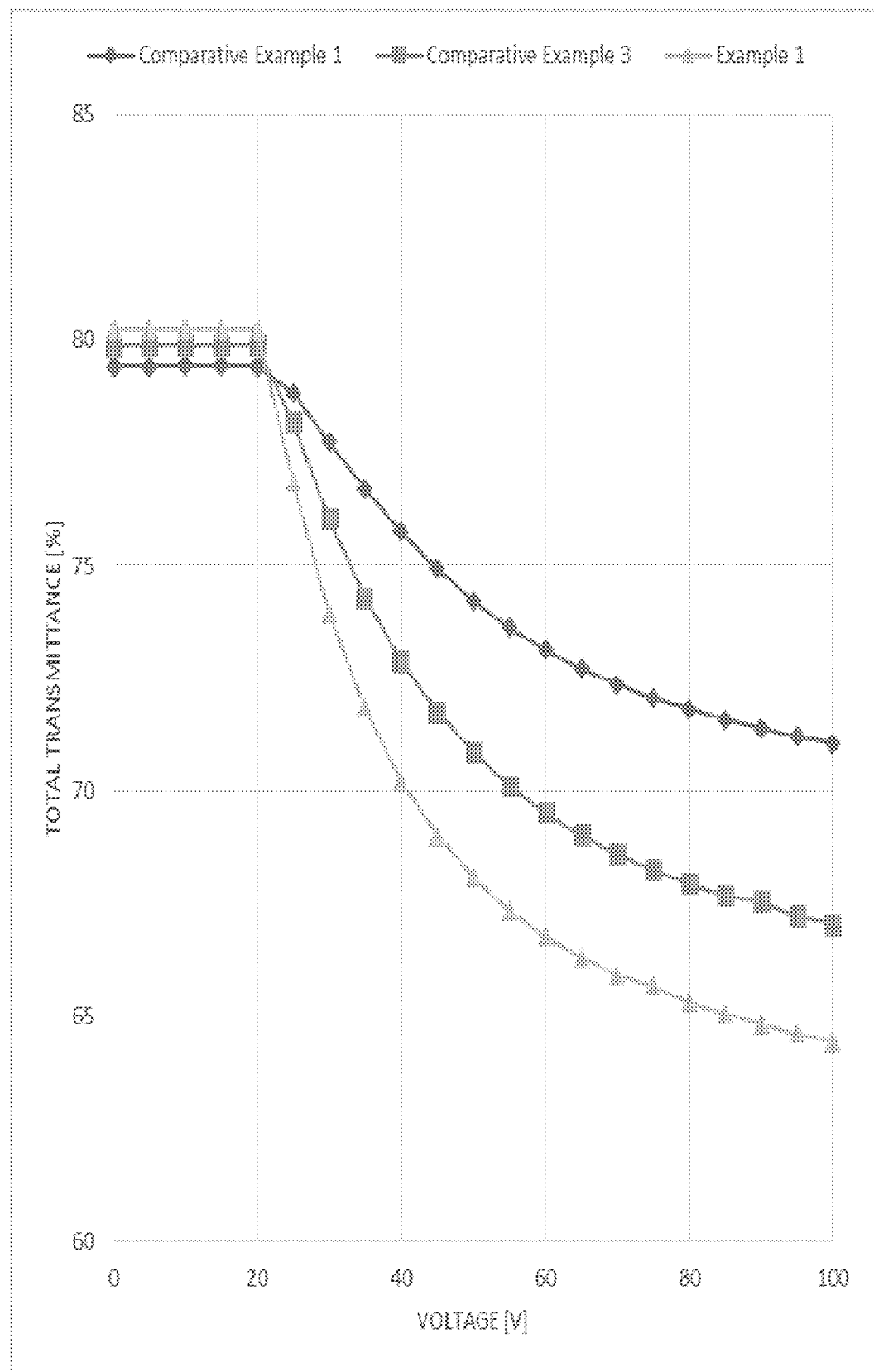

The invention claimed is:

1. A LC medium comprising, one or more non-polymerisable LC compounds, one or more polymerisable LC compounds, one or more carbazole oxime ester photoinitiators, and one or more dichroic dyes, wherein one or more of the carbazole oxime ester photoinitiators are selected from the group of compounds of formula CO-1,

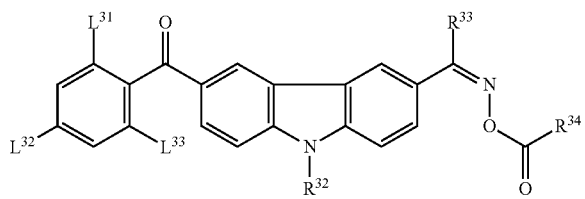

CO-1 wherein
$L^{31}$ to $L^{33}$ each and independently denotes H, alkyl, alkoxy, thioalkyl, alkylcarbonyl, alkoxycarbonyl, alkylcarbonyloxy or alkoxycarbonyloxy with 1 to 5 C atoms; F, Cl, CN, $NO_2$, OCN, SCN, or mono- oligo- or polyfluorinated alkyl or alkoxy with 1 to 4 C atoms; or —($X^{31}$—$Sp^{31}$-$A^{31}$),
$X^{31}$ denotes —O—, —S—CO—, —COO—, —OCO—, —O—COO—, —CO—$NR^{xx}$—, —$NR^{xx}$—CO—, —$NR^{xx}$—CO—$NR^{yy}$— or a single bond,
$R^{xx}$ and $R^{yy}$ each, independently of one another, denote H or alkyl having 1 to 12 C atoms,
$Sp^{31}$ is a spacer group or a single bond,
$A^{31}$ denotes each and independently an aryl, heteroaryl, non-aromatic alicyclic and heterocyclic group, optionally having one or more substituents, which are selected from the group comprising silyl, sulfo, sulfonyl, formyl, amine, inline, nitrile, mercapto, nitro, halogen, $C_{1-12}$ alkyl, $C_{6-12}$ aryl, $C_{1-12}$ alkoxy, hydroxyl, or combinations of these groups, and
$R^{32}$ to $R^{34}$ each, independently of one another, denote H or alkyl having 1 to 12 C atoms.

2. The LC medium according to claim 1, which comprises one or more non-polymerisable LC compounds, which are selected from the group of the compounds of the formulae I-1, I-2, I-3 and I-4,

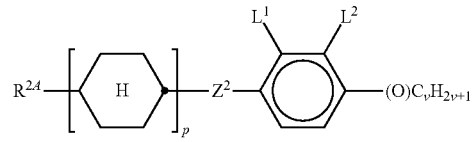

I-1

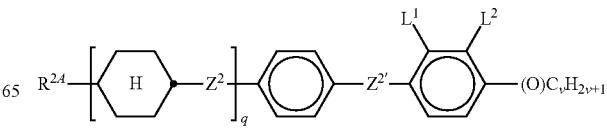

I-2

-continued

I-3

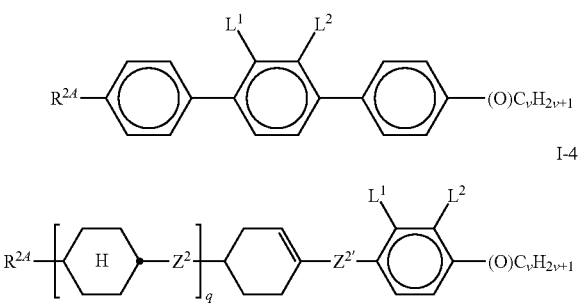

I-4 in which
R$^{2A}$ denotes H, an alkyl or alkoxy radical having 1 to 15 C atoms, where, in addition, one or more CH$_2$ groups in these radicals may each be replaced, independently of one another, by —C≡C—, —CF$_2$O—, —CH=CH—,

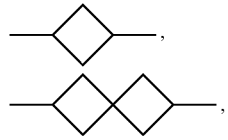

—O—, —CO—O— or —O—CO— in such a way that O atoms are not linked directly to one another, and in which, in addition, one or more H atoms may be replaced by halogen,
L$^1$ and L$^2$ each, independently of one another, denote F, Cl, CF$_3$ or CHF$_2$,
Z$^2$ and Z$^{2'}$ each, independently of one another, denote a single bond, —CH$_2$CH$_2$—, —CH=CH—, —CF$_2$O—, —OCF$_2$—, —CH$_2$O—, —OCH$_2$—, —COO—, —OCO—, —C$_2$F$_4$—, —CF=CF— or —CH=CHCH$_2$O—,
p denotes 0, 1 or 2,
q denotes 0 or 1,
(O)C$_v$H$_{2v+1}$ denotes OC$_v$H$_{2v+1}$ or C$_v$H$_{2v+1}$, and
v denotes 1 to 6.

3. The LC medium according to claim 1, which comprises one or more non-polymerisable LC compounds, which are selected from the group of the compounds of the formula N,

N

in which
R$^{N1}$ and R$^{N2}$ each, independently of one another, denote an alkyl or alkoxy radical having 1 to 15 C atoms, where, in addition, one or more CH$_2$ groups in these radicals may each be replaced, independently of one another, by —C≡C—, —CF$_2$O—,

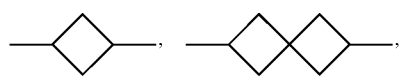

—O—, —CO—O—, —O—CO— in such a way that O atoms are not linked directly to one another, and in which, in addition, one or more H atoms may be replaced by halogen,
A$^{N1}$, A$^{N2}$ and A$^{N3}$ each, independently of one another, denote 1,4-phenylene, 2-fluoro-1,4-phenylene, 3-fluoro-1,4-phenylene, trans-1,4-cyclohexylene, in which, in addition, one or two CH$_2$ groups may be replaced by —O—, or 1,4-cyclohexenylene,
Z$^{N1}$ and Z$^{N2}$ each, independently of one another, denote a single bond, —CH$_2$CH$_2$—, —COO—, —OCO—, —C≡C—, —CH$_2$O—, —OCH$_2$—, —CF$_2$O—, —OCF$_2$— or —CH=CH—, and
n denotes 0, 1 or 2.

4. The LC medium according to claim 1, characterised in that one or more polymerisable LC compounds are selected from the group of compounds of the following formula M:

$$P^1\text{-}Sp^1\text{-}A^2\text{-}(Z^1\text{-}A^1)_n\text{-}Sp^2\text{-}P^2 \qquad M$$

in which,
P$^1$, P$^2$ each, independently of one another, denote a polymerisable group,
Sp$^1$, Sp$^2$ on each occurrence, identically or differently, denote a spacer group or a single bond,
where one or more of the groups P$^1$-Sp$^1$-, -Sp$^2$-P$^2$ may denote a radical R$^{aa}$, with the proviso that at least one of the groups P$^1$-Sp$^1$-, -Sp$^2$-P$^2$ does not denote R$^{aa}$,
A$^1$, A$^2$ each, independently of one another, denote a radical selected from the following groups:
a) the group consisting of trans-1,4-cyclohexylene, 1,4-cyclohexenylene and 4,4'-bicyclohexylene, in which, in addition, one or more non-adjacent CH$_2$ groups may be replaced by —O— and/or —S— and in which, in addition, one or more H atoms may be replaced by a group L, or a radical of the formula

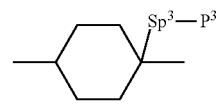

b) the group consisting of 1,4-phenylene and 1,3-phenylene, in which, in addition, one or two CH groups may be replaced by N and in which, in addition, one or more H atoms may be replaced by a group L or -Sp$^3$-P,
c) the group consisting of tetrahydropyran-2,5-diyl, 1,3-dioxane-2,5-diyl, tetrahydrofuran-2,5-diyl, cyclobutane-1,3-diyl, piperidine-1,4-diyl, thiophene-2,5-diyl and selenophene-2,5-diyl, each of which may also be mono- or polysubstituted by L,
d) the group consisting of saturated, partially unsaturated or fully unsaturated, and optionally substituted, polycyclic radicals having 5 to 20 cyclic C atoms, one or more of which may, in addition, be replaced by heteroatoms,
where, in addition, one or more H atoms in these radicals may be replaced by a group L or -Sp$^3$-P, and/or one or more double bonds may be replaced by single bonds, and/or one or more CH groups may be replaced by N,
P$^3$ denotes a polymerisable group,
Sp$^3$ denotes a spacer group,
where one or more of the groups -Sp$^3$-P$^3$ may denote a radical R$^{aa}$, n denotes 0, 1, 2 or 3, Z$^1$ in each case, independently of one another, denotes —CO—O—, —O—CO—, —CH$_2$O—, —OCH$_2$—, —CF$_2$O—, —OCF$_2$—, or —(CH$_2$)$_n$—, where n is 2, 3 or 4, —O—, —CO—, —C(R$^c$R$^d$)—, —CH$_2$CF$_2$—, —CF$_2$CF$_2$— or a single bond, L on each occurrence, identically or differently, denotes F, Cl, CN, SCN, SF$_5$ or straight-chain or branched, in each case optionally mono- or polyfluorinated alkyl, alkoxy, alkenyl, alkynyl, alkylcarbonyl, alkoxycarbonyl, alkylcarbonyloxy or alkoxycarbonyloxy having 1 to 12 C atoms, if branched is present, then 3 to 12 C atoms, R$^o$, R$^{oo}$ each, independently of one another, denote H, F or straight-chain having 1 to 12 C atoms or branched alkyl having 3 to 12 C atoms, in which, in addition, one or more H atoms may be replaced by F, R$^c$ and R$^d$ each, independently of one another, denote H or alkyl having 1 to 6 C atoms, R$^{aa}$ denotes H, F, Cl, CN or straight-chain or branched alkyl having 1 to 25 C atoms, if branched is present, then 3 to 12 C atoms, in which, in addition, one or more non-adjacent CH$_2$ groups may each be replaced, independently of one another, by C(R$^o$)=C(R$^{oo}$)—, —C≡C—, —O—, —S—, —CO—, —CO—O—, —O—CO—, —O—CO—O— in such a way that O and/or S atoms are not linked directly to one another, and in which, in addition, one or more H atoms may be replaced by F, Cl, CN or P$^1$-Sp$^1$-, where the groups —OH, —NH$_2$, —SH, —NHR, —C(O)OH and —CHO are not present in R$^{aa}$.

5. The LC medium according to claim 1, wherein one or more dichroic dyes are selected from the group of compounds of formula D,

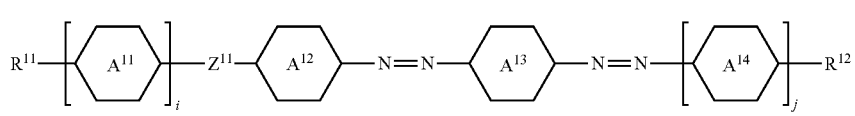

wherein,

to

are at each occurrence, identically or differently, selected from

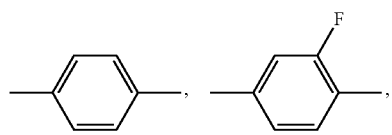

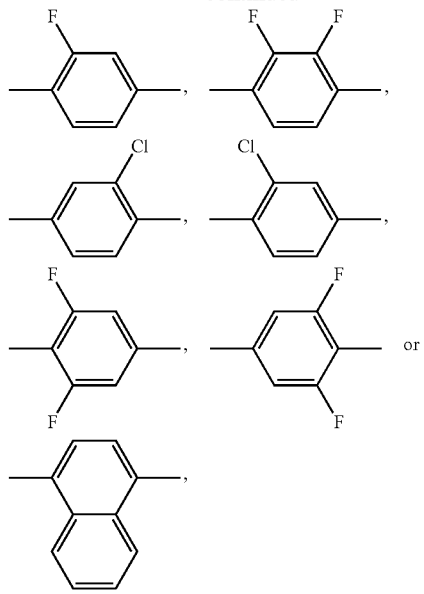

and, in case i is 2 or more, the terminal one of group

may also be

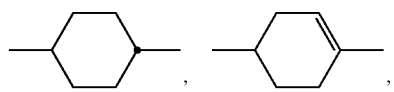

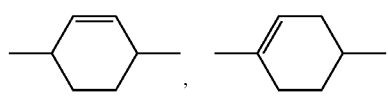

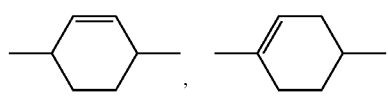

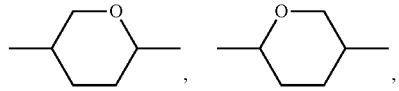

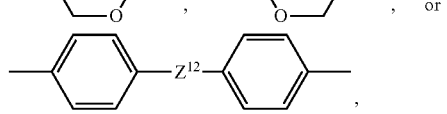

and, in case j is 2 or more, the terminal one of group

may also be

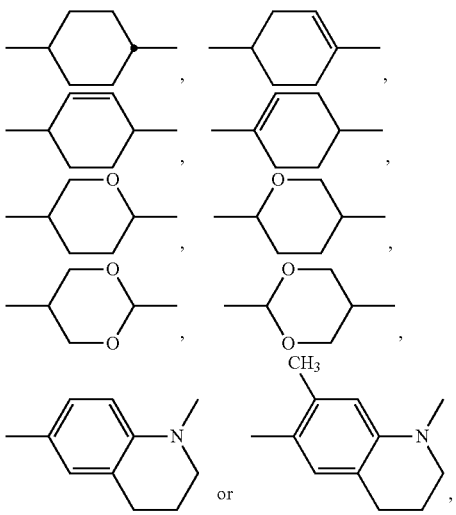

$Z^{11}$ and $Z^{12}$ are, independently of each other, —N=N—, —OCO— or —COO—, $R^{11}$ and $R^{12}$ are, independently of each other, alkyl, alkoxy, fluorinated alkyl or fluorinated alkoxy, alkenyl, alkenyloxy, alkoxyalkyl or fluorinated alkenyl, alkylaminyl, dialkylaminyl, alkylcarbonyl, alkyloxycarbonyl, alkylcarbonyloxy, alkyloxycarbonyloxy or alkylcyclohexylalkyl, and i and j are independently of each other 1, 2, 3 or 4.

6. The LC medium according to claim 1, comprising more than 5 wt. % and not more than 30 wt. % of the polymerisable LC compounds.

7. A process for the preparation of the LC medium according to claim 1, comprising the step of mixing one or more non-polymerisable LC compounds, one or more polymerisable liquid crystal compounds, and one or more carbazole oxime ester photoinitiators, with one or more dichroic dyes.

8. A method which comprises including the LC medium according to claim 1 in a light modulation element.

9. A light modulation element comprising a LC cell comprising two substrates and an electrode arrangement and a layer of a LC medium according to claim 1 located between the substrates, characterised in that the polymerisable compounds of the LC medium are polymerized.

10. The light modulation element according to claim 9, which is a polymer network liquid crystalline (PNLC) light modulation element operated in the normally transparent mode.

11. The light modulation element according to claim 9, which is a light shutter for transparent OLED displays or a window element.

12. A process for the production of the light modulation element according to claim 9 comprising at least the steps of cutting and cleaning of the substrates,
providing electrode structures on each of the substrates,
optionally providing an alignment layer on the electrode structure,
assembling the cell using an adhesive with spacer,
filling the cell with the LC medium, and
exposing the LC medium to actinic radiation that induces photopolymerisation of the polymer is able compounds.

13. A method which comprises including the light modulation element according to claim 9 in an electro optical device.

14. An electro optical device which comprises the light modulation element according to claim 9.

15. The LC medium according to claim 2, wherein $L^1$ and $L^2$ each denote F.

16. The LC medium according to claim 4, wherein n denotes 1 or 2, $Y^1$ and $Y^2$ each, independently of one another, denote H, F, Cl, CN, $OCF_3$ or $CF_3$, $R^c$ and $R^d$ each, independently of one another, denote H, methyl or ethyl, $R^{aa}$ denotes straight-chain or branched, optionally mono- or polyfluorinated, alkyl, alkoxy, alkenyl, alkynyl, alkylcarbonyl, alkoxycarbonyl or alkylcarbonyloxy having 1 to 12 C atoms, where the alkenyl and alkynyl radicals contain at least two C atoms and the branched radicals contain at least three C atoms, and $A^1$, $A^2$ each, independently of one another, denote bicyclo[1.1.1]pentane-1,3-diyl, bicyclo[2.2.2]octane-1,4-diyl, spiro[3.3]heptane-2,6-diyl,

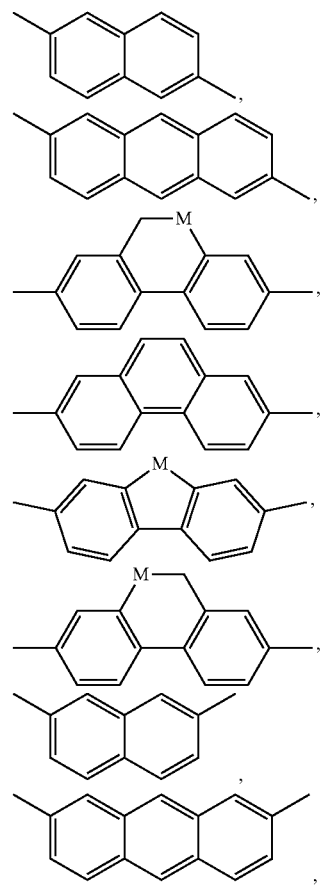

-continued

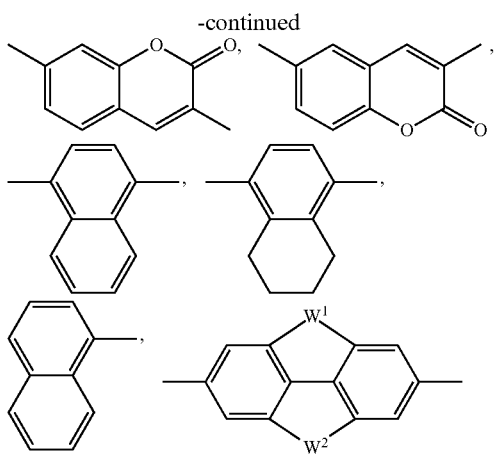

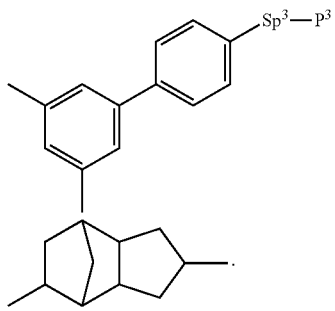

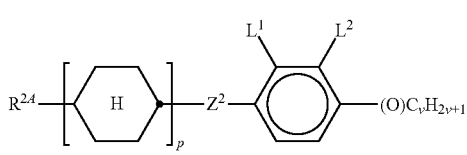

17. A LC medium comprising, one or more non-polymerisable LC compounds, one or more polymerizable LC compounds, one or more carbazole oxime ester photoinitiators, and one or more dichroic dyes, wherein A) said one or more non-polymerizable LC compounds are selected from the group of the compounds of the formulae I-1, I-2, I-3 and I-4,

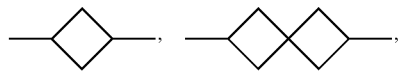

I-1

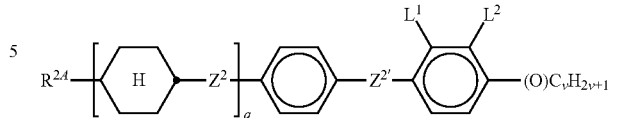

I-2

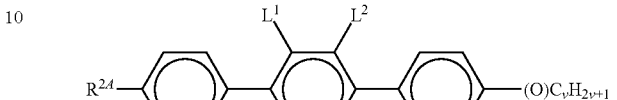

I-3

I-4

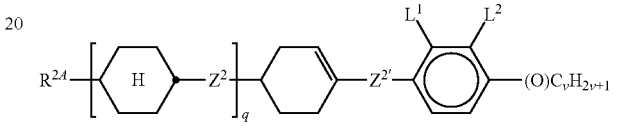

in which $R^{2A}$ denotes H, an alkyl or alkoxy radical having 1 to 15 C atoms, where, in addition, one or more $CH_2$ groups in these radicals may each be replaced, independently of one another, by —C≡C—, —$CF_2$O—, —CH=CH—,

—O—, —CO—O— or —O—CO— in such a way that O atoms are not linked directly to one another, and in which, in addition, one or more H atoms may be replaced by halogen, $L^1$ and $L^2$ each, independently of one another, denote F, Cl, $CF_3$ or $CHF_2$, $Z^2$ and $Z^{2'}$ each, independently of one another, denote a single bond, —$CH_2CH_2$—, —CH=CH—, —$CF_2$O—, —$OCF_2$—, —$CH_2$O—, —$OCH_2$—, —COO—, —OCO—, —$C_2F_4$—, —CF=CF— or —CH=CHCH$_2$O—, p denotes 0, 1 or 2, q denotes 0 or 1, (O)$C_vH_{2v+1}$ denotes $OC_vH_{2v+1}$ or $C_vH_{2v+1}$, and v denotes 1 to 6; and B) said one or more dichroic dyes are selected from the group of compounds of formula D,

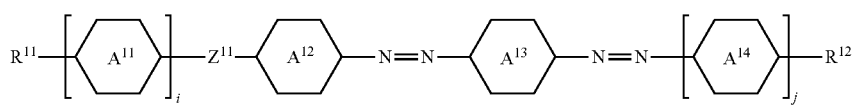

D wherein,

to

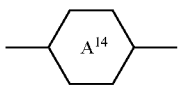

are at each occurrence, identically or differently, selected from

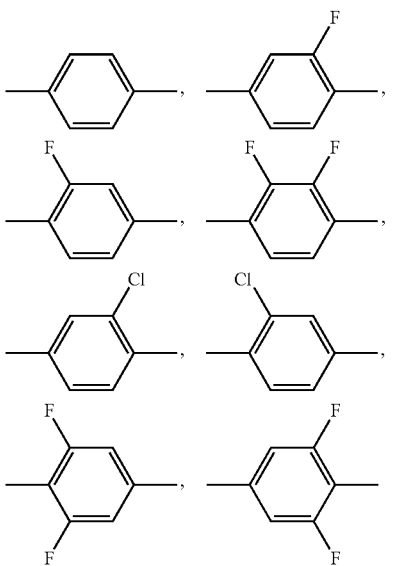

and, in case i is 2 or more, the terminal one of group

may also be

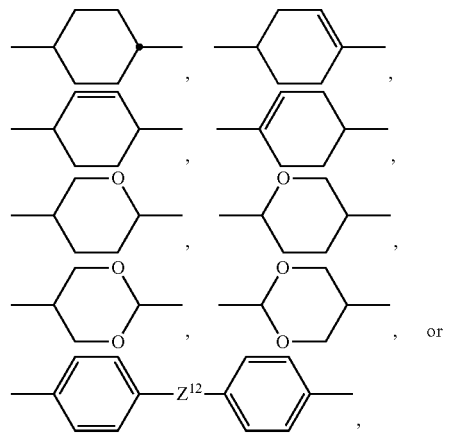

and, in case j is 2 or more, the terminal one of group

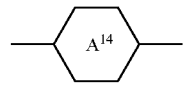

may also be

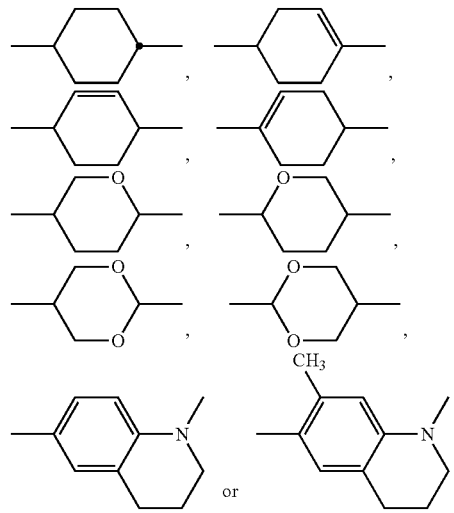

$Z^{11}$ and $Z^{12}$ are, independently of each other, —N═N—, —OCO— or COO—, $R^{11}$ and $R^{12}$ are, independently of each other, alkyl, alkoxy, fluorinated alkyl or fluorinated alkoxy, alkenyl, alkenyloxy, alkoxyalkyl or fluorinated alkenyl, alkylaminyl, dialkylaminyl, alkylcarbonyl, alkyloxycarbonyl, alkylcarbonyloxy, alkyloxycarbonyloxy or alkylcyclohexylalkyl, and i and j are independently of each other 1, 2, 3 or 4.

* * * * *